United States Patent
Hayakawa

(10) Patent No.: US 6,885,687 B2
(45) Date of Patent: Apr. 26, 2005

(54) SEMICONDUCTOR LASER MODULE HAVING OPTICAL WAVELENGTH CONVERSION ELEMENT AND SEMICONDUCTOR LASER ELEMENT WHICH INCLUDES QUANTUM-WELL SUBLAYERS HAVING DIFFERENT THICKNESSES AND/OR COMPOSITIONS

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 65 days.

(21) Appl. No.: 09/840,025

(22) Filed: Apr. 24, 2001

(65) Prior Publication Data

US 2002/0009102 A1 Jan. 24, 2002

(30) Foreign Application Priority Data

Apr. 24, 2000 (JP) ........................................ 2000-121981

(51) Int. Cl.[7] ............................................... H01S 5/00
(52) U.S. Cl. .............................. 372/45; 372/21; 372/43
(58) Field of Search .............................. 372/21, 43, 45

(56) References Cited

U.S. PATENT DOCUMENTS 5,790,578 A * 8/1998 Takano ........................ 372/45

FOREIGN PATENT DOCUMENTS

| JP | 10-254001 | 9/1998 | ............. G02F/1/37 |
| JP | 10254001 A | * 9/1998 | ............. G02F/1/37 |

OTHER PUBLICATIONS

Abstract 10–254001, Sep. 25, 1998.

* cited by examiner

*Primary Examiner*—Minsun Oh Harvey
*Assistant Examiner*—Cornelius H. Jackson
(74) *Attorney, Agent, or Firm*—Sughrue Mion, PLLC

(57) ABSTRACT

A semiconductor laser module includes: a semiconductor laser element which emits laser light; a waveguide-type optical wavelength selection element which includes an optical waveguide, and selects a first portion of the laser light having a predetermined wavelength; and an optical wavelength conversion element which converts a second portion of the laser light having the predetermined wavelength to wavelength-converted laser light having a converted wavelength. The semiconductor laser element, the waveguide-type optical wavelength selection element, and the optical wavelength conversion element are coupled. The semiconductor laser element contains a multiple-quantum-well active layer including a plurality of quantum-well sublayers, where one of the plurality of quantum-well sublayers is different from another of the plurality of quantum-well sublayers in thickness and/or composition.

35 Claims, 38 Drawing Sheets

F I G . 5
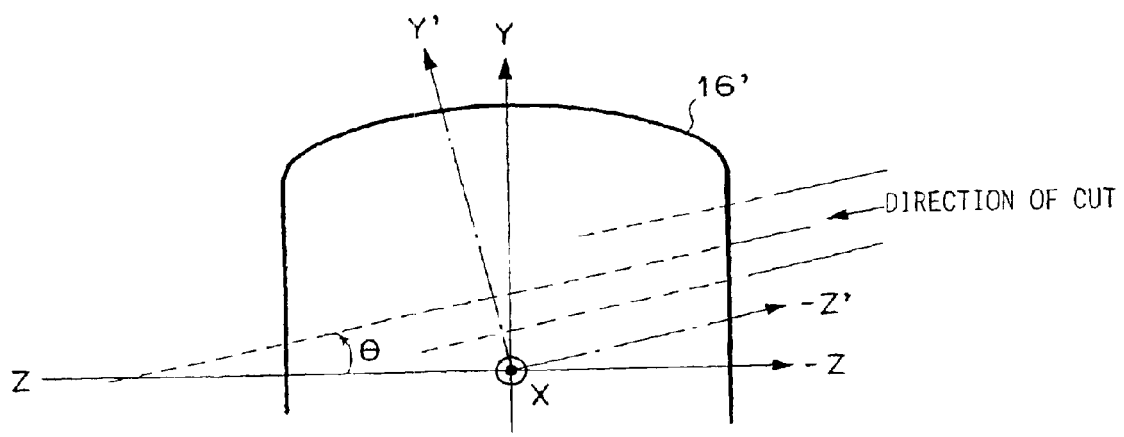

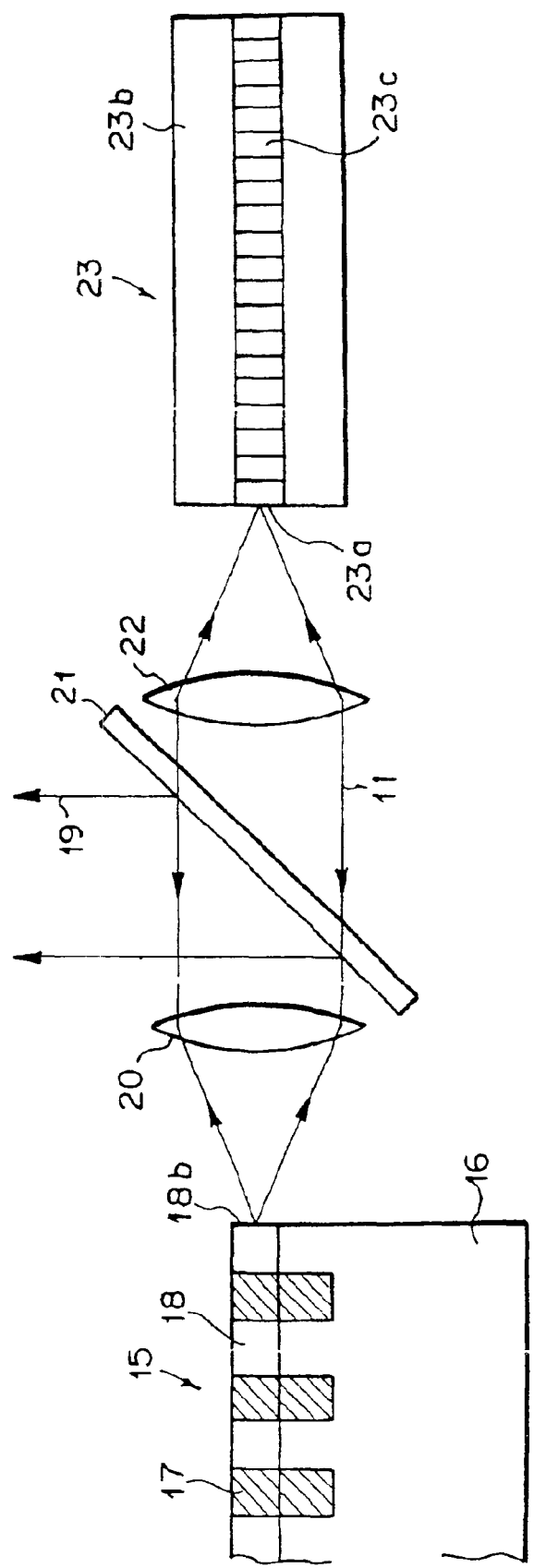
F I G. 21

F I G. 28
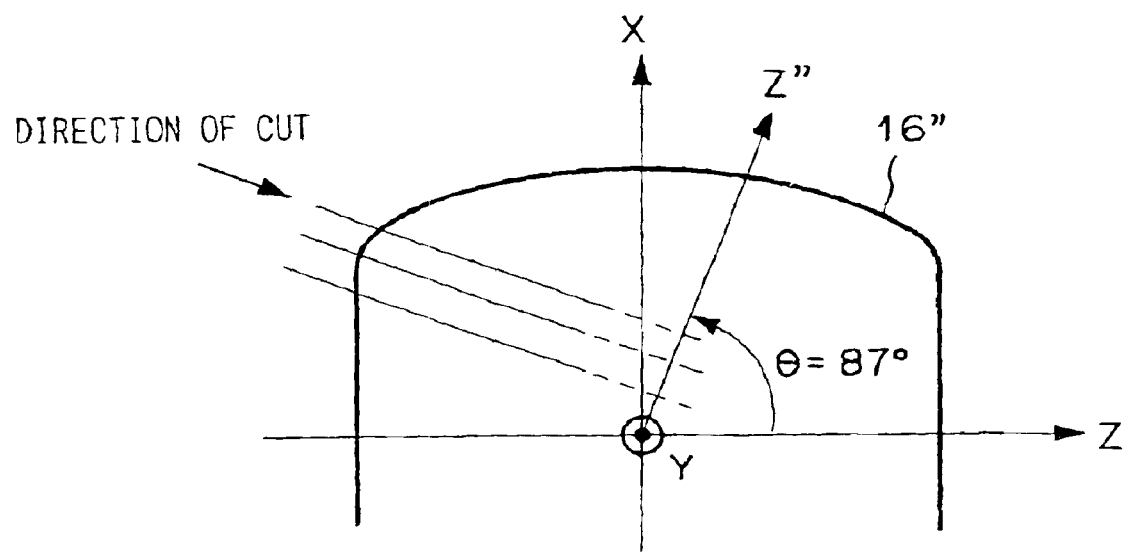

F I G . 29
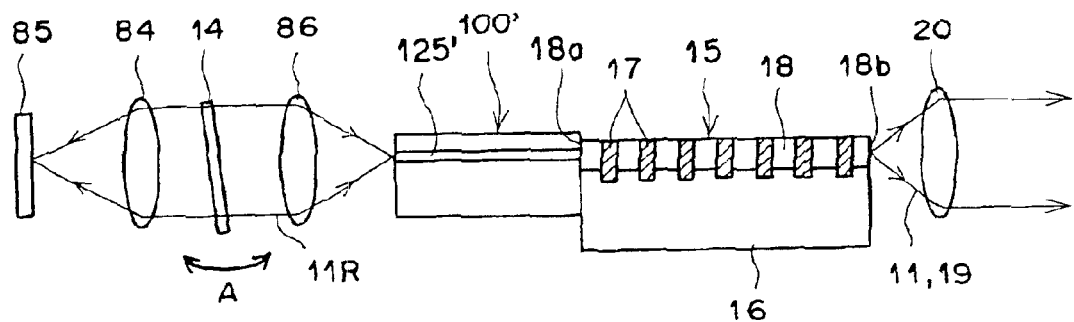

F I G. 34
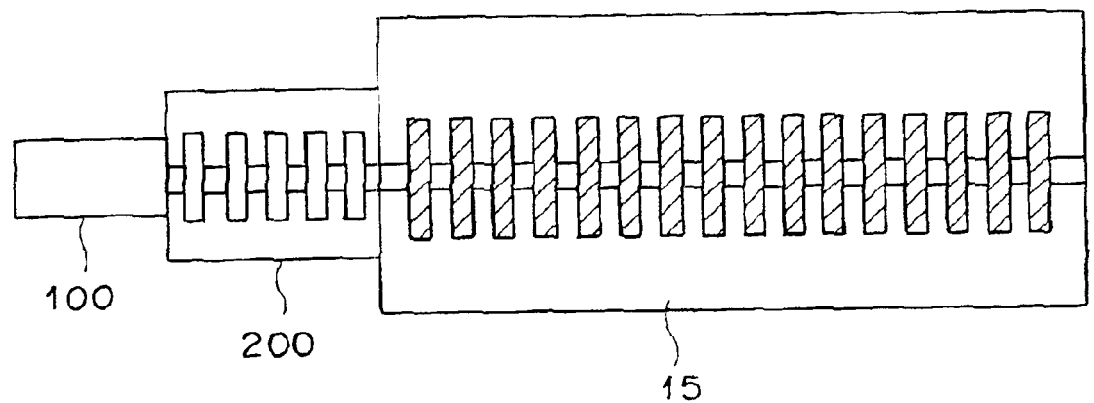

F I G . 35
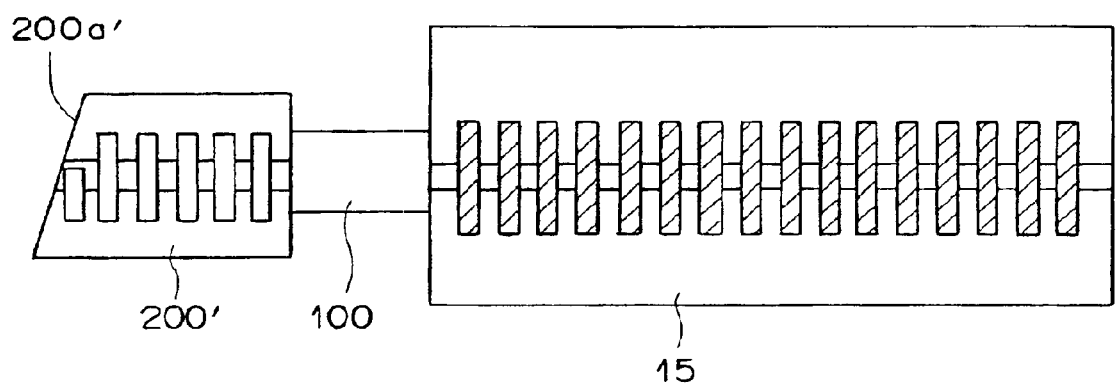

F I G . 36
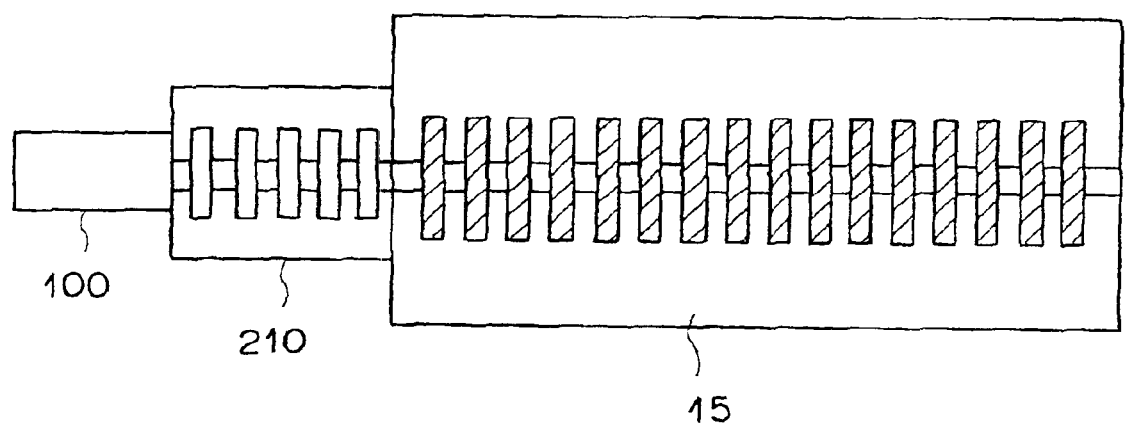

SEMICONDUCTOR LASER MODULE HAVING OPTICAL WAVELENGTH CONVERSION ELEMENT AND SEMICONDUCTOR LASER ELEMENT WHICH INCLUDES QUANTUM-WELL SUBLAYERS HAVING DIFFERENT THICKNESSES AND/OR COMPOSITIONS

BACKGROUND OF THE INVENTION

1. Field of the Invention

The present invention relates to a semiconductor laser module in which a wavelength of laser light emitted from a semiconductor laser element is selected and locked by using an optical wavelength selection element, and the laser light having the selected wavelength is converted to wavelength-converted laser light such as a second harmonic by using an optical-waveguide type wavelength conversion element.

2. Description of the Related Art

Optical wavelength conversion elements which comprise a substrate made of a ferroelectric crystal exhibiting a nonlinear optical effect, an optical waveguide formed on the substrate so as to extend in a certain direction, and domain-inverted portions periodically formed along the optical waveguide are known, for example, as disclosed in Japanese Unexamined Patent Publication (JUPP) No. 10(1998)-254001, which is assigned to the present assignee. Such optical wavelength conversion elements convert a fundamental wave propagating in the optical waveguide, to a second harmonic or the like. In the domain-inverted portions, the direction of spontaneous polarization of the substrate is inverted.

JUPP No. 10(1998)-254001 also discloses a semiconductor laser module (or an optical wavelength conversion module) in which an optical wavelength conversion element is coupled to a semiconductor laser element which emits a laser beam as a fundamental wave. JUPP No. 10(1998)-254001 further discloses a semiconductor laser module in which an external resonator including an optical wavelength selection element (such as a narrow-band-pass filter) is combined with a semiconductor laser element which emits a laser beam as a fundamental wave so that an oscillation wavelength of the semiconductor laser element is locked at a desired wavelength.

Japanese patent application No. 11(1999)-345724, which is also assigned to the present assignee, discloses a semiconductor laser module in which a semiconductor laser element emitting a laser beam as a fundamental wave, an optical wavelength selection element selecting a wavelength of the laser beam, and an optical wavelength conversion element converting the wavelength of the laser beam are directly coupled. The contents of Japanese patent application No. 11(1999)-345724 are incorporated in this specification by reference.

In the above semiconductor laser module, an optical-waveguide-type optical wavelength selection element is coupled to a semiconductor laser element directly or through an optical wavelength conversion element. Therefore, light having a phase-matching wavelength in a wavelength conversion portion in the optical wavelength conversion element can be selected by using the optical-waveguide-type optical wavelength selection element, and fed back to the semiconductor laser element. Thus, the oscillation wavelength of the semiconductor laser element can be selected and locked, and stable wavelength-converted light can be obtained.

In semiconductor laser modules which comprise an optical wavelength conversion element including a periodically formed domain-inverted portions (periodic domain-inverted structure), the oscillation wavelength of a semiconductor laser element as a light source of a fundamental wave is required to be precisely locked at a predetermined wavelength at which phase matching of wavelength-converted light occurs in the optical wavelength conversion element. In addition, demands for precisely setting the wavelength of wavelength-converted light at a desired value exist in a wide range of applications in which semiconductor laser modules including optical wavelength conversion elements of other types are used. In order to precisely lock the wavelength of wavelength-converted light, it is necessary that the oscillation wavelength of the semiconductor laser element as a light source of a fundamental wave is precisely locked at a predetermined wavelength.

The range of wavelengths which each semiconductor laser element can emit is determined by the peak width of the gain spectrum of the semiconductor laser element. Therefore, when the semiconductor laser element is manufactured, the (chemical) composition and the thickness of the active layer of the semiconductor laser element must be precisely controlled so that the wavelengths which the semiconductor laser element can emit are adjusted in the vicinity of a desired wavelength.

In addition, since, in practice, efficiencies in wavelength conversion and optical coupling, transmittances of filters, and the like are different in each semiconductor laser module, reflectances in external wavelength locking systems, when viewed from semiconductor laser elements, vary with the individual semiconductor laser modules. Further, the gain spectra of oscillations in the semiconductor laser elements vary with the reflectances. Generally, when the variation in the reflectance increases, the wavelength locking becomes difficult. However, it is desirable that the oscillation wavelength of each semiconductor laser element can be locked in a wide wavelength range, i.e., the oscillation wavelength can be adjusted in the wide wavelength range. In addition, when the wavelength range in which the oscillation wavelength of each semiconductor laser element can be locked is wider, conditions concerning the composition and the thickness of the active layer of the semiconductor laser element can be more eased, and the semiconductor laser element for use in a semiconductor laser module can be manufactured at a higher yield rate.

Nevertheless, the wavelength ranges in which the oscillation wavelengths of the semiconductor laser elements used as light sources of fundamental waves in the conventional semiconductor laser modules can be adjusted are not sufficiently wide. Therefore, in the conventional semiconductor laser modules using a semiconductor laser element as a light sources of a fundamental wave, the adjustment operations required for the wavelength locking are complicated, and the control of the composition and thickness of the active layer of the semiconductor laser element is difficult.

SUMMARY OF THE INVENTION

The object of the present invention is to provide a semiconductor laser module in which a wavelength of laser light emitted from a semiconductor laser element can be selected and locked in a wide wavelength range by using an optical wavelength selection element before the laser light having the selected wavelength is converted to wavelength-converted laser light by using an optical-waveguide type wavelength conversion element.

(1) According to the first aspect of the present invention, there is provided a semiconductor laser module comprising: a semiconductor laser element which emits laser light; an optical wavelength selection element which selects a first portion of the laser light having a predetermined wavelength in order to feed back the first portion of the laser light to the semiconductor laser element; and an optical wavelength conversion element which includes an optical waveguide, receives a second portion of the laser light in the optical waveguide, and converts the second portion of the laser light to wavelength-converted laser light having a converted wavelength. The semiconductor laser element comprises a multiple-quantum-well active layer including a plurality of quantum-well sublayers, where one of the plurality of quantum-well sublayers is different from another of the plurality of quantum-well sublayers in thickness and/or composition.

Preferably, the semiconductor laser module according to the first aspect of the present invention may also have one or any possible combination of the following additional features (i) to (xxv).

(i) The optical wavelength selection element may be a transparent-type optical wavelength selection element arranged between the semiconductor laser element and the optical wavelength conversion element, and select the first portion of the laser light after the laser light is reflected by an end facet of the optical wavelength conversion element.

(ii) The semiconductor laser module according to the first aspect of the present invention may further comprise an optical splitting unit which splits a third portion of the laser light from the second portion of the laser light which is received by the optical wavelength conversion element, and a reflection unit which reflects the third portion of the laser light in order to feed back the third portion of the laser light to the semiconductor laser element. The optical wavelength selection element may be a transparent-type optical wavelength selection element arranged in an optical path of the third portion of the laser light between the reflection unit and the semiconductor laser element.

(iii) In the semiconductor laser module having the feature (ii), the optical wavelength selection element may be a thin-film narrow-band-pass filter formed on a surface of the reflection unit.

(iv) The semiconductor laser module according to the first aspect of the present invention may further comprise a reflection unit which reflects a third portion of the laser light after the third portion of the laser light propagates through the optical wavelength conversion element, in order to feed back the third portion of the laser light to the semiconductor laser element. In addition, the optical wavelength selection element may be a transparent-type optical wavelength selection element arranged in an optical path of the third portion of the laser light between the reflection unit and the semiconductor laser element.

(v) In the semiconductor laser module having the feature (iv), the optical wavelength selection element may be a thin-film narrow-band-pass filter formed on a surface of the reflection unit.

(vi) The semiconductor laser module having the feature (iv) may further comprise an optical system which separates the wavelength-converted laser light from the third portion of the laser light.

(vii) The semiconductor laser module according to the first aspect of the present invention may further comprise a reflection unit which reflects a third portion of the laser light which is emitted from the semiconductor laser element in a direction opposite to a direction toward the optical wavelength conversion element, in order to feed back the third portion of the laser light to the semiconductor laser element. In addition, the optical wavelength selection element may be a transparent-type optical wavelength selection element arranged in an optical path of the third portion of the laser light between the reflection unit and the semiconductor laser element.

(viii) In the semiconductor laser module having the feature (vii), the optical wavelength selection element may be a thin-film narrow-band-pass filter formed on a surface of the reflection unit.

(ix) In the semiconductor laser module according to the first aspect of the present invention, the optical wavelength selection element may be a narrow-band-pass filter.

(x) In the semiconductor laser module having the feature (ix), the narrow-band-pass filter may be realized by a thin-film band-pass filter.

(xi) In the semiconductor laser module having the feature (x), the thin-film band-pass filter may be formed on a light-exit end facet of the semiconductor laser element from which the laser light is emitted.

(xii) In the semiconductor laser module according to the first aspect of the present invention, the optical wavelength selection element may be a reflection-type optical wavelength selection element arranged between the semiconductor laser element and the optical wavelength conversion element, and selectively reflect the first portion of the laser light in order to feed back the first portion of the laser light to the semiconductor laser element.

(xiii) In the semiconductor laser module having the feature (xii), the optical wavelength selection element may be a fiber grating realized by an optical fiber having a core in which a plurality of refractive-index variation portions are formed at regular intervals.

(xiv) The semiconductor laser module having the feature (xiii) may further comprise a convergence optical system which converges the laser light on an end surface of the fiber grating.

(xv) In the semiconductor laser module according to the first aspect of the present invention, the optical wavelength selection element may be a reflectance-type optical wavelength selection element, and selectively reflect the first portion of the laser light after the first portion of the laser light propagates through the optical wavelength conversion element, in order to feed back the first portion of the laser light to the semiconductor laser element.

(xvi) In the semiconductor laser module having the feature (xv), the optical wavelength selection element may be a fiber grating realized by an optical fiber having a core in which a plurality of refractive-index variation portions are formed at regular intervals.

(xvii) The semiconductor laser module having the feature (xvi) may further comprise a convergence optical system which converges the laser light on an end surface of the fiber grating.

(xviii) The semiconductor laser module having the feature (xii) may further comprise an optical system which separates the wavelength-converted laser light from the second portion of the laser light after the second portion of the laser light propagates through the optical wavelength conversion element.

(xix) In the semiconductor laser module according to the first aspect of the present invention, the first portion of the laser light may be emitted by the semiconductor laser element in a direction opposite to a direction toward the optical wavelength conversion element. In addition, the optical wavelength selection element may be a reflectance-type optical wavelength selection element, and selectively reflects the first portion of the laser light in order to feed back the first portion of the laser light to the semiconductor laser element.

(xx) In the semiconductor laser module having the feature (xix), the optical wavelength selection element may be a fiber grating realized by an optical fiber having a core in which a plurality of refractive-index variation portions are formed at regular intervals.

(xxi) The semiconductor laser module having the feature (xx) may further comprise a convergence optical system which converges the laser light on an end surface of the fiber grating.

(xxii) In the semiconductor laser module according to the first aspect of the present invention, the optical wavelength selection element may be a bulk grating.

(xxiii) In the semiconductor laser module according to the first aspect of the present invention, the semiconductor laser element may be coupled to an end facet of the optical wavelength conversion element.

(xxiv) In the semiconductor laser module according to the first aspect of the present invention, the optical wavelength conversion element may further comprise a substrate made of a ferroelectric crystal exhibiting a nonlinear optical effect, where the optical waveguide is extends along a surface of the substrate, and a plurality of domain-inverted portions periodically formed along the optical waveguide, where a direction of spontaneous polarization is inverted in the plurality of domain-inverted portions. In addition, the optical wavelength conversion element may convert the second portion of the laser light to the wavelength-converted laser light when the second portion of the laser light propagates in the optical waveguide.

(xxv) In the semiconductor laser module having the feature (xxiv), the direction of the spontaneous polarization may be inclined at an angle relative to the surface of the substrate, in a plane perpendicular to a direction in which the optical waveguide extends, where the angle is greater than 0 degrees and smaller than 90 degrees.

(2) According to the second aspect of the present invention, there is provided a semiconductor laser module comprising: a semiconductor laser element which has a light-exit end facet, and emits laser light through the light-exit end facet; an optical wavelength conversion element which comprises an optical waveguide and an end facet, receives a first portion of the laser light having a predetermined wavelength in the optical waveguide, and converts the first portion of the laser light to wavelength-converted laser light having a converted wavelength, where the end facet of the optical wavelength conversion element reflects a second portion of the laser light, and the semiconductor laser element is coupled to the end facet of the optical wavelength conversion element through a transparent-type thin-film narrow-band-pass filter; and the transparent-type thin-film narrow-band-pass filter which is sandwiched between the end facet of the optical wavelength conversion element and the light-exit end facet of the semiconductor laser element, and selects a third portion of the laser light having the predetermined wavelength, from the second portion of the laser light reflected by the end facet of the optical wavelength conversion element, in order to feed back the third portion of the laser light to the semiconductor laser element. The semiconductor laser element comprises a multiple-quantum-well active layer including a plurality of quantum-well sublayers, where one of the plurality of quantum-well sublayers is different from another of the plurality of quantum-well sublayers in thickness and/or composition.

Preferably, the semiconductor laser module according to the second aspect of the present invention may also have one or any possible combination of the aforementioned additional feature (xxv) and the following additional feature (xxvi).

(xxvi) The optical wavelength conversion element may further comprise a substrate made of a ferroelectric crystal exhibiting a nonlinear optical effect, where the optical waveguide is extends along a surface of the substrate, and a plurality of domain-inverted portions periodically formed along the optical waveguide, where a direction of spontaneous polarization is inverted in the plurality of domain-inverted portions. In addition, the optical wavelength conversion element may convert the first portion of the laser light to the wavelength-converted laser light when the first portion of the laser light propagates in the optical waveguide.

(3) According to the third aspect of the present invention, there is provided a semiconductor laser module comprising: a semiconductor laser element which has a light-exit end facet, and emits laser light through the light-exit end facet; an optical wavelength conversion element which comprises an optical waveguide and an end facet, receives a first portion of the laser light having a predetermined wavelength in the optical waveguide, and converts the first portion of the laser light to wavelength-converted laser light having a converted wavelength, where the semiconductor laser element is coupled to the end facet of the optical wavelength conversion element through a reflection-type thin-film narrow-band-pass filter; and the reflection-type thin-film narrow-band-pass filter which is sandwiched between the end facet of the optical wavelength conversion element and the light-exit end facet of the semiconductor laser element, and selectively reflects a second portion of the laser light having the predetermined wavelength in order to feed back the second portion of the laser light to the semiconductor laser element. The semiconductor laser element comprises a multiple-quantum-well active layer including a plurality of quantum-well sublayers, where one of the plurality of quantum-well sublayers is different from another of the plurality of quantum-well sublayers in thickness and/or composition.

Preferably, the semiconductor laser module according to the third aspect of the present invention may also have one or any possible combination of the aforementioned additional features (xxv) and (xxvi).

(4) According to the fourth aspect of the present invention, there is provided a semiconductor laser module comprising: a semiconductor laser element which emits laser light; a waveguide-type optical wavelength selection element which includes an optical waveguide, and selects a first portion of the laser light having a predetermined wavelength; and an optical wavelength conversion element which converts a second portion of the laser light having the predetermined wavelength to wavelength-converted laser light having a converted wavelength. The semiconductor laser element, the waveguide-type optical wavelength selection element, and the optical wavelength conversion element are directly coupled. The semiconductor laser element comprises a multiple-quantum-well active layer including a plurality of quantum-well sublayers, where one of the plurality of quantum-well sublayers is different from another of the plurality of quantum-well sublayers in thickness and/or composition.

Preferably, the semiconductor laser module according to the fourth aspect of the present invention may also have one or any possible combination of the aforementioned additional feature (xxv) and the following additional features (xxvii) to (xxxv).

(xxvii) The waveguide-type optical wavelength selection element may be a reflection type, and the semiconductor laser element may be arranged between the waveguide-type optical wavelength selection element and the optical wavelength conversion element.

(xxviii) In the semiconductor laser module having the feature (xxvii), the waveguide-type optical wavelength selection element may have two end facets, and one of the two end facets which is located farther from the semiconductor laser element may be beveled with respect to a direction in which the optical waveguide extends.

(xxix) In the semiconductor laser module according to the fourth aspect of the present invention, the waveguide-type optical wavelength selection element may be a reflection type, the optical wavelength conversion element may be arranged between the waveguide-type optical wavelength selection element and the semiconductor laser element.

(xxx) In the semiconductor laser module having the feature (xxix), the waveguide-type optical wavelength selection element may have two end facets, and one of the two end facets which is located farther from the semiconductor laser element may be beveled with respect to a direction in which the optical waveguide extends.

(xxxi) In the semiconductor laser module according to the fourth aspect of the present invention, the waveguide-type optical wavelength selection element may be a reflection type, and the waveguide-type optical wavelength selection element may be arranged between the semiconductor laser element and the optical wavelength conversion element.

(xxxii) In the semiconductor laser module according to the fourth aspect of the present invention, the waveguide-type optical wavelength selection element may include a DBR (distributed Bragg reflection) grating.

(xxxiii) In the semiconductor laser module according to the fourth aspect of the present invention, the waveguide-type optical wavelength selection element may be a transparent type, and the optical wavelength conversion element may have a reflection surface which reflects light toward the semiconductor laser element, and the waveguide-type optical wavelength selection element may be arranged between the semiconductor laser element and the optical wavelength conversion element.

(xxxiv) The semiconductor laser module according to the fourth aspect of the present invention may further comprise a band-pass filter which is inserted in the optical waveguide in the waveguide-type optical wavelength selection element.

(xxxv) In the semiconductor laser module according to the fourth aspect of the present invention, the optical wavelength conversion element may further comprise a substrate made of a ferroelectric crystal exhibiting a nonlinear optical effect, an optical waveguide formed on the substrate so as to extend along a surface of the substrate, and a plurality of domain-inverted portions periodically formed along the optical waveguide in the optical wavelength conversion element, where a direction of spontaneous polarization is inverted in the plurality of domain-inverted portions. The optical wavelength conversion element may convert the second portion of the laser light to the wavelength-converted laser light when the second portion of the laser light propagates in the optical waveguide in the optical wavelength conversion element.

(5) The advantages of the present invention are explained below.

According to the present invention, at least one of the plurality of quantum-well sublayers constituting the multiple-quantum-well active layer of the semiconductor laser element is different from the other of the plurality of quantum-well sublayers in thickness and/or composition. Due to this difference, the peak width of the gain spectrum of the semiconductor laser element is increased, compared with the conventional semiconductor laser elements in which a plurality of quantum-well sublayers constituting a multiple-quantum-well active layer have an identical thickness and an identical composition.

FIG. 38A is a graph indicating an example of an overall gain spectrum of a semiconductor laser element in which a plurality of quantum-well sublayers constituting a multiple-quantum-well active layer have an identical thickness and an identical composition, and FIG. 38B is a graph indicating an example of an overall gain spectrum of a semiconductor laser element in which at least one of the plurality of quantum-well sublayers constituting the multiple-quantum-well active layer of the semiconductor laser element is different from the other of the plurality of quantum-well sublayers in thickness and/or composition. In each of FIGS. 38A and 38B, the gain peak wavelength is indicated by $\lambda 2$, and wavelengths at which the gain is 20 dB smaller than the peak gain are indicated by $\lambda 1$ and $\lambda 3$. That is, the wavelengths $\lambda 1$ and $\lambda 3$ are the lower and upper limits of a wavelength range in which each semiconductor laser element can oscillate with an external resonator which selects a wavelength. The difference between the wavelengths $\lambda 1$ and $\lambda 3$ is about 5 nm in the case of FIG. 38A, and 11.5 nm in the case of FIG. 38B. That is, the overall gain spectrum of the semiconductor laser element in which at least one of the plurality of quantum-well sublayers constituting the multiple-quantum-well active layer of the semiconductor laser element is different from the other quantum-well sublayer or quantum-well sublayers in thickness and/or composition is greater than the overall gain spectrum of the semiconductor laser element in which a plurality of quantum-well sublayers constituting a multiple-quantum-well active layer have an identical thickness and an identical composition.

It is not necessary that each quantum-well sublayer is different from any other quantum-well sublayer, and it is sufficient that at least one quantum-well sublayer is different from the other quantum-well sublayer or quantum-well sublayers. Instead of differentiating the thickness of at least one quantum-well sublayer, it is possible to differentiate the composition of at least one quantum-well sublayer, or differentiate both of the thickness and the composition of at least one quantum-well sublayer.

The present invention can be applied to a semiconductor laser module when a multiple-quantum-well active layer of a semiconductor laser element constituting the semiconductor laser module includes at least two quantum-well sublayers. When the multiple-quantum-well active layer includes more than two quantum-well sublayers, each quantum-well sublayer can be differentiated from the other quantum-well sublayers in at least one of the thickness and the composition. In this case, for example, in a multiple-quantum-well active layer, it is possible to differentiate the thickness of one quantum-well sublayer from the thicknesses of the other quantum-well sublayers, and the composition of another quantum-well sublayer from the compositions of the other quantum-well sublayers.

Since, in the semiconductor laser module according to the present invention, a semiconductor laser element having an increased peak width of a gain spectrum is used as a light source of a fundamental wave, it is possible to sufficiently increase the width of the wavelength range in which the oscillation wavelength of the semiconductor laser element can be locked. That is, in the semiconductor laser module according to the present invention, the adjustment operations for the wavelength locking is easy, and the control of the composition and the thickness of the active layer is also easy. Therefore, it is possible to increase productivity in manufacturing the semiconductor laser module.

In addition, when the wavelength range in which the oscillation wavelength of the semiconductor laser element can be locked is large, the variation in the oscillation wavelength of the semiconductor laser element, which is typically ±2 nm, does not cause a problem, and therefore a semiconductor laser module which emits wavelength-converted laser light having a stable wavelength can be realized.

Further, when an optical wavelength conversion element including a periodic domain-inverted structure is used, and the direction of the spontaneous polarization in the substrate is inclined at an angle θ relative to a surface of the substrate, and the angle θ is greater than 0 degrees and smaller than 90 degrees, efficient wavelength conversion is achieved for the following reasons.

FIG. 2 is a perspective view of a semiconductor laser module using a waveguide-type optical wavelength conversion element 15 which includes a periodic domain-inverted structure 17. As illustrated in FIG. 2, the direction of the spontaneous polarization in the substrate, i.e., the direction of the Z axis, is not perpendicular to the surface 16a of the substrate 16 of the optical wavelength conversion element 15. Therefore, even when the laser beam 11 emitted from the semiconductor laser element 100 is incident on the optical channel waveguide 18 so that the direction of linear polarization of the laser beam 11, which is indicated by the arrows Q in FIG. 2, is parallel to the surface 16a of the substrate 16, the maximum nonlinear optical coefficient $d_{33}$ can be effectively utilized, and therefore the wavelength conversion is possible. In this case, the direction of the electric field vector of the laser beam 11 is parallel to the surface 16a of the substrate 16, and the laser beam 11 propagates through the optical channel waveguide 18 in a TE mode. At this time, the effective nonlinear optical coefficient becomes $d_{33}\cos\theta$.

When the laser beam 11 is incident on the optical channel waveguide 18 so that the direction of linear polarization of the laser beam 11 is parallel to the surface 16a of the substrate 16, a λ/2 plate or the like, which rotates the direction of linear polarization, is unnecessary. Therefore, the optical system which enters a fundamental wave in the optical wavelength conversion element can be simplified, and it is possible to directly couple the semiconductor laser element 100 to the end facet of the optical channel waveguide 18. When the laser beam 11 enters the optical channel waveguide 18 as above, the input efficiency of the laser beam 11 into the optical channel waveguide 18 is increased.

Japanese Unexamined Patent Publication No. 10(1998)-254001, which is assigned to the present assignee, provides detailed explanations on a preferable range of the above angle θ and the reasons for the preferableness. The contents of JUPP No. 10(1998)-254001 are incorporated in this specification by reference.

DESCRIPTION OF THE DRAWINGS

FIG. 5 is a diagram illustrating a 3-degree Y-cut of an ingot.

FIG. 21 is a diagram illustrating a portion of the semiconductor laser module of FIG. 20.

FIG. 28 is a diagram illustrating a 87-degree Z-cut of an ingot.

FIG. 29 is a side view of the construction of the twenty-second embodiment of the semiconductor laser module according to the present invention.

FIG. 34 is a side view of the construction of the twenty-seventh embodiment of the semiconductor laser module according to the present invention.

FIG. 35 is a side view of the construction of the twenty-eighth embodiment of the semiconductor laser module according to the present invention.

FIG. 36 is a side view of the construction of the twenty-ninth embodiment of the semiconductor laser module according to the present invention.

DESCRIPTION OF PREFERRED EMBODIMENTS

Figure 1:
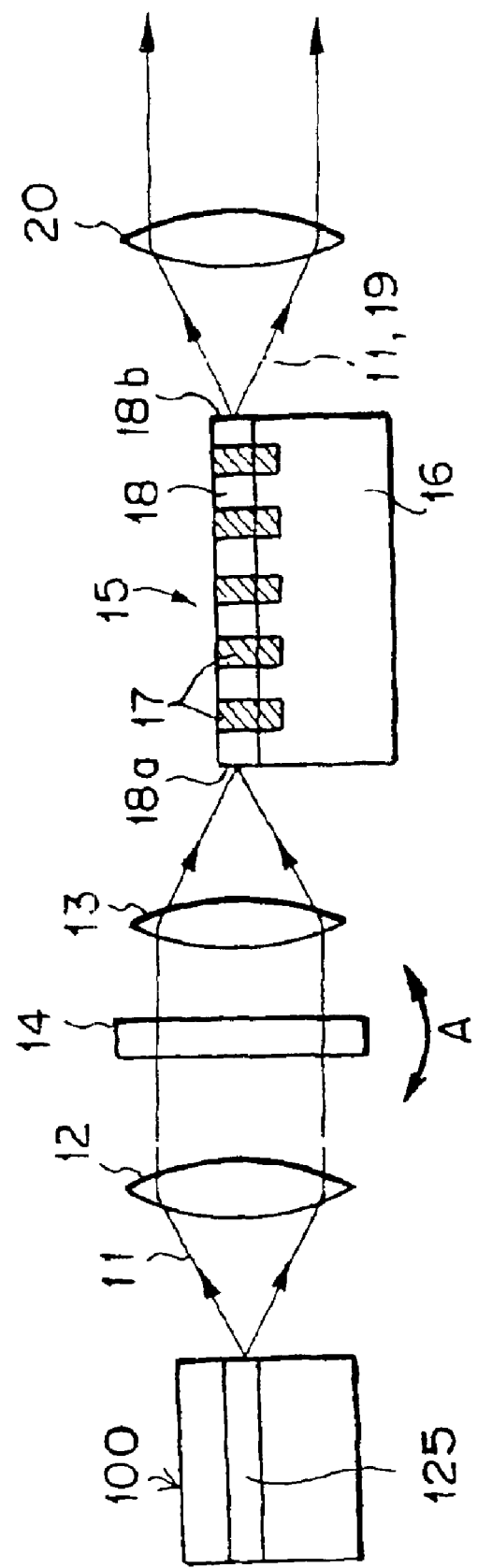
FIG. 1 is a side view of the construction of the first embodiment of the semiconductor laser module according to the present invention.

Embodiments of the present invention are explained in detail below with reference to drawings. In the drawings and the following explanations, elements which are common to different embodiments bear the same reference numbers, respectively, and explanations of the functions of the common elements are not repeated in the respective embodiments.

First Embodiment

Figure 2:
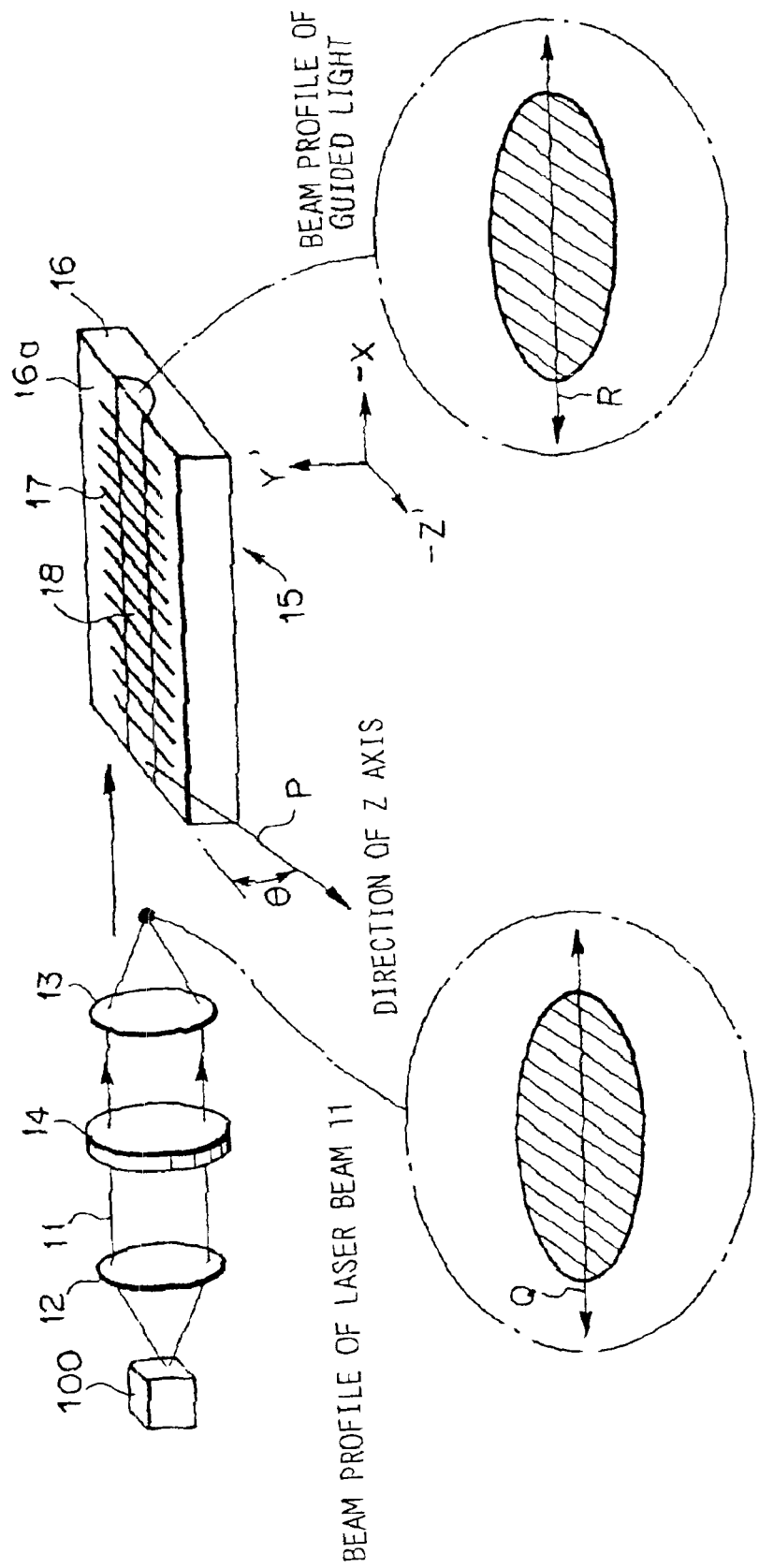
FIG. 2 is a perspective view of the semiconductor laser module illustrating details of a waveguide-type optical wavelength conversion element.

FIG. 1 is a side view of the construction of the first embodiment of the semiconductor laser module according to the present invention, and FIG. 2 is a perspective view of the semiconductor laser module illustrating details of a waveguide-type optical wavelength conversion element. The semiconductor laser module of FIG. 1 comprises a semiconductor laser element (semiconductor laser diode) 100, a collimator lens 12, a condenser lens 13, a narrow-band-pass filter 14, a waveguide-type optical wavelength conversion element 15, and a collimator lens 20.

The semiconductor laser element 100 oscillates in a fundamental transverse mode, and emits a divergent laser beam 11 having a wavelength of about 946 nm as a fundamental wave. The collimator lens 12 collimates the divergent laser beam 11;, and the condenser lens 13 converges the collimated laser beam. The narrow-band-pass filter 14 is arranged between the collimator lens 12 and the condenser lens 13, and functions as an optical wavelength selection element.

Figure 3:
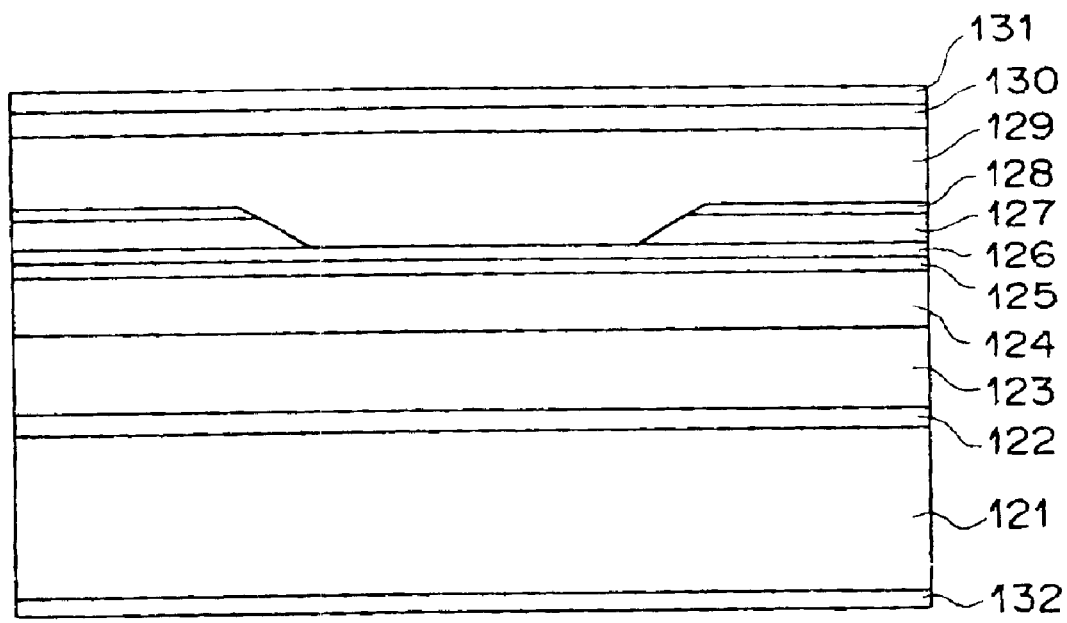
FIG. 3 is a cross-sectional view of the semiconductor laser element used in the semiconductor laser module as the first embodiment of the present invention.

The construction of the semiconductor laser element 100 and a process for producing the semiconductor laser element 100 are explained below with reference to FIG. 3, which is a cross-sectional view of the semiconductor laser element 100.

In the first MOCVD stage, an n-type GaAs buffer layer 122 being doped with $5\times10^{17}$ cm$^{-3}$ Si and having a thickness of 0.5 micrometers, an n-type In$_{0.48}$Ga$_{0.52}$P lower cladding layer 123 being doped with $5\times10^{17}$ cm$^{-3}$ Si and having a thickness of 1.5 micrometers, an In$_{0.13}$Ga$_{0.87}$As$_{0.75}$P$_{0.25}$ lower optical waveguide layer 124 having a thickness of 0.45 micrometers, an undoped multiple-quantum-well (MQW) active layer 125 having a thickness of 7 nm, an undoped In$_{0.13}$Ga$_{0.87}$As$_{0.75}$P$_{0.25}$ upper optical waveguide layer 126 having a thickness of 0.1 micrometers, an n-type In$_{0.48}$(Ga$_{0.7}$Al$_{0.3}$)$_{0.52}$P current confinement layer 127 being doped with $2\times10^{18}$ cm$^{-3}$ Si and having a thickness of 0.8 micrometers, and an n-type In$_{0.48}$Ga$_{0.52}$P layer 128 being doped with $2\times10^{18}$ cm$^{-3}$ Si and having a thickness of 10 nm are formed in this order by reduced-pressure MOCVD on an n-type GaAs substrate 121 which is doped with $2\times10^{18}$ cm$^{-3}$ Si. The lower portion of the In$_{0.13}$Ga$_{0.87}$As$_{0.75}$P$_{0.25}$ lower optical waveguide layer 124 having a thickness of 0.4 micrometers is doped with $8\times10^{17}$ cm$^{-3}$ Si, and the upper portion of the In$_{0.13}$Ga$_{0.87}$As$_{0.75}$P$_{0.25}$ lower optical waveguide layer 124 having a thickness of 0.05 micrometers is undoped.

Next, a stripe groove having a width W of 2.5 micrometers is formed in the n-type In$_{0.48}$Ga$_{0.52}$P layer 128 and the n-type In$_{0.48}$(Ga$_{0.7}$Al$_{0.3}$)$_{0.52}$P current confinement layer 127 by photolithography and etching using HCl. This etching selectively stops just above the undoped In$_{0.13}$Ga$_{0.87}$As$_{0.75}$P$_{0.25}$ upper optical waveguide layer 126.

Next, in the second MOCVD stage, a p-type In$_{0.48}$Ga$_{0.52}$P upper cladding layer 129 being doped with $7\times10^{17}$ cm$^{-3}$ Zn and having a thickness of 1 micrometer and a p-type GaAs cap layer 130 being doped with $2\times10^{19}$ cm$^{-3}$ Zn and having a thickness of 0.1 micrometers are formed in this order.

Thereafter, the bottom surface of the n-type GaAs substrate 121 is polished until the total thickness of the layered structure becomes about 100 micrometers. Then, a (Ti/Pt/Au) p electrode 131 and a (AuGe/Ni/Au) n electrode 132 are formed by evaporation and heat treatment as illustrated in FIG. 3.

Finally, a laser bar is cut out, end facets are coated, and laser chips are cut out in conventional manners. Thus, the semiconductor laser element 100 is completed.

When both of the end facets are cleaved and coated so as to exhibit a reflectance of about 30%, the semiconductor laser element 100 oscillates at the wavelength of about 946 nm.

The undoped multiple-quantum-well (MQW) active layer 125 is comprised of a $GaAs_{0.75}P_{0.25}$ barrier sublayer having a thickness of 9 nm, an $In_{0.15}Ga_{0.85}As$ first quantum-well sublayer having a thickness of 5.6 nm, an $In_{0.13}Ga_{0.87}As_{0.75}P_{0.25}$ barrier sublayer having a thickness of 4 nm, an $In_{0.15}Ga_{0.85}As$ second quantum-well sublayer having a thickness of 6 nm, an $In_{0.13}Ga_{0.87}As_{0.75}P_{0.25}$ barrier sublayer having a thickness of 4 nm, an $In_{0.15}Ga_{0.85}As$ third quantum-well sublayer having a thickness of 6.4 nm, and a $GaAs_{0.75}P_{0.25}$ barrier sublayer having a thickness of 9 nm. That is, the three quantum-well sublayers have different thicknesses.

The optical wavelength conversion element 15 is made by forming a periodic domain-inverted structure and an optical channel waveguide 18 in a substrate 16. The substrate 16 is made of a $LiNbO_3$ crystal doped with MgO, and hereinafter called the MgO-LN substrate. The $LiNbO_3$ crystal is a ferroelectric crystal exhibiting a nonlinear optical effect. The concentration of MgO in the MgO-LN substrate 16 is, for example, 5 mol %. The periodic domain-inverted structure includes periodically formed domain-inverted portions 17 in which the direction of spontaneous polarization, which is originally oriented in the direction of the Z axis of the substrate 16, is inverted. The optical channel waveguide 18 is formed along the periodic domain-inverted structure.

The periodic domain-inverted structure is formed so that the domain-inverted portions 17 are arranged along the X axis of the substrate 16. The period $\Lambda$ of the periodic domain-inverted structure is 5.3 micrometers, which is determined based on consideration of the chromatic dispersion of the refractive index of MgO-LN, so as to be the first-order period for the wavelength in the vicinity of 980 nm. For example, the periodic domain-inverted structure can be formed by the method disclosed in Japanese Unexamined Patent Publication (JPP) No. 6(1994)-242478, which is assigned to the present assignee. The contents of JPP No. 6(1994)-242478 are incorporated in this specification by reference.

For example, the optical channel waveguide 18 can be formed as follows.

After the periodic domain-inverted structure is formed as above, a metal mask pattern is formed on the +Z face of the substrate 16 by the well-known photolithography and lift-off technique. Next, the substrate 16 is sunk in pyrophosphoric acid, and undergoes a proton exchange process. Then, the mask is removed, and thereafter the substrate 16 undergoes an annealing process. Finally, both end facets 18a and 18b of the optical channel waveguide 18 are edge-polished. Thus, formation of the waveguide-type optical wavelength conversion element 15 is completed.

A process of producing the optical wavelength conversion element 15 is explained below in detail with reference to FIGS. 4, 5, and 6.

Figure 4:
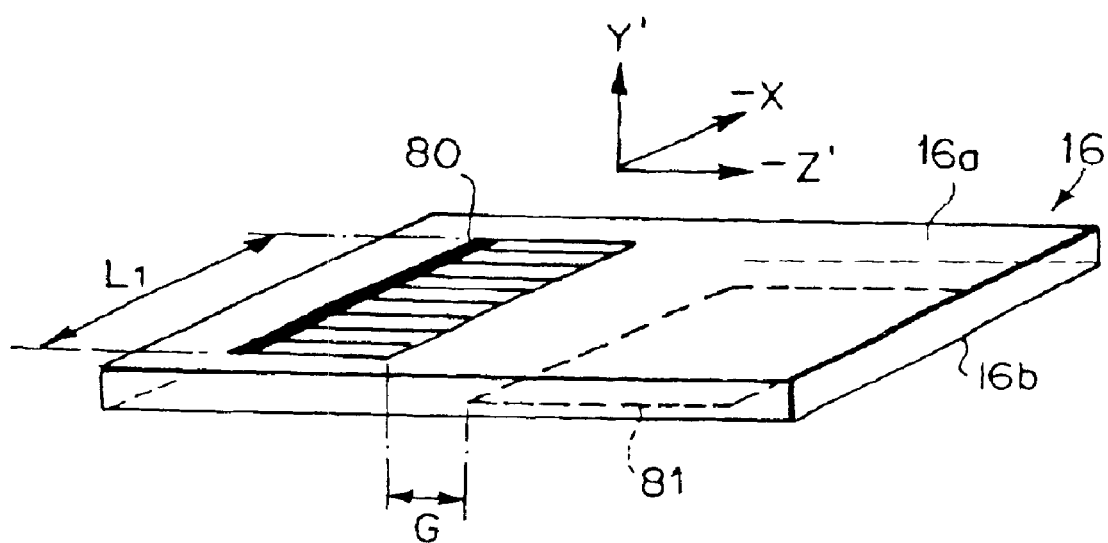
FIG. 4 is a perspective view of the MgO-LO crystal substrate 16 of the optical wavelength conversion element 15.

FIG. 4 is a perspective view of the MgO-LO crystal substrate 16 of the optical wavelength conversion element 15. The substrate 16 is produced by cutting an ingot 16' made of a MgO-LO crystal by a plane perpendicular to a Y' axis, which is obtained by rotating the Y axis in the Y-Z plane toward the Z axis by an angle $\theta$ of 3 degrees, as illustrated in FIG. 5, polishing the cut surface, and performing a monopolarization operation. This substrate is called a 3-degree Y-cut substrate. For example, the MgO-LO crystal substrate 16 has a thickness of 0.3 mm. The tolerance of the angle $\theta$ is ±0.1 degrees. In addition, an axis to which the Z axis is rotated by the above rotation is called Z' axis. That is, the Z' axis makes the angle $\theta$ with the Z axis, and is parallel to the surfaces 16a and 16b of the substrate 16 and perpendicular to the X axis, while the Y' axis is perpendicular to the surfaces 16a and 16b of the substrate 16.

A comb electrode 80 is arranged on the +Z side of the surface 16a, and a plate electrode 81 is arranged on the −Z side of the surface 16b, as illustrated in FIG. 4. When a pulse voltage is applied between the comb electrode 80 and the plate electrode 81 so that the comb electrode 80 is a positive electrode, and the plate electrode 81 is a negative electrode, the direction of spontaneous polarization of the substrate 16, which is originally oriented in the +Z direction, is inverted in the portions of the substrate 16 in which electric fields generated by the above voltage are effective, as illustrated in FIG. 6. Thus, the domain-inverted portions 17 are produced. Since the direction of the spontaneous polarization is inclined at the angle $\theta$ of 3 degrees relative to the surface 16a of the substrate 16, the direction of the polarization in the domain-inverted portions 17 is also inclined at the angle $\theta$ of 3 degrees relative to the surface 16a of the substrate 16.

In this example, the comb electrode 80 and the plate electrode 81 are made of chromium. However, the comb electrode 80 and the plate electrode 81 can be made of any other material which has a lower electric resistance than that of the MgO-LO crystal substrate 16. The comb electrode 80 and the plate electrode 81 can be formed by using conventional photolithography. For example, the comb electrode 80 and the plate electrode 81 have a thickness of 20 to 100 micrometers and a length $L_1$ of 6 mm, and there is a gap G of 100 to 500 micrometers between the comb electrode 80 and the plate electrode 81. In this embodiment, the period $\Lambda$ of the comb electrode 80 is 4.75 micrometers, and each tooth of the comb electrode 80 has a length of 1,000 micrometers and a width of 0.5 micrometers, and the plate electrode 81 has a width of 100 micrometers in the direction of the Z' axis.

The above voltage is applied in a vacuum of, for example, $5 \times 10^{-5}$ Torr in order to prevent current leakage. Alternatively, the voltage can be applied in an insulating oil. The pulse width of the applied voltage can be 1 to 10 seconds.

The width of each of the domain-inverted portions 17 in the directions perpendicular to the Z axis increases with the applied voltage. As is well known, the efficiency in wavelength conversion using a periodic domain-inverted structure is maximized when the ratio between the width of each domain-inverted portion and the width of each domain-uninverted portion located between each pair of adjacent domain-inverted portions is 1:1. The ratio becomes 1:1 at room temperature, for example, when the voltage of about 4,000 V is applied across the gap G of 200 micrometers, or when the voltage of about 3,500 V is applied across the gap G of 400 micrometers. When the temperature of the substrate is increased to 200° C. in each case, the optimum voltage is reduced to about one-third the voltage applied at room temperature.

Figure 6:
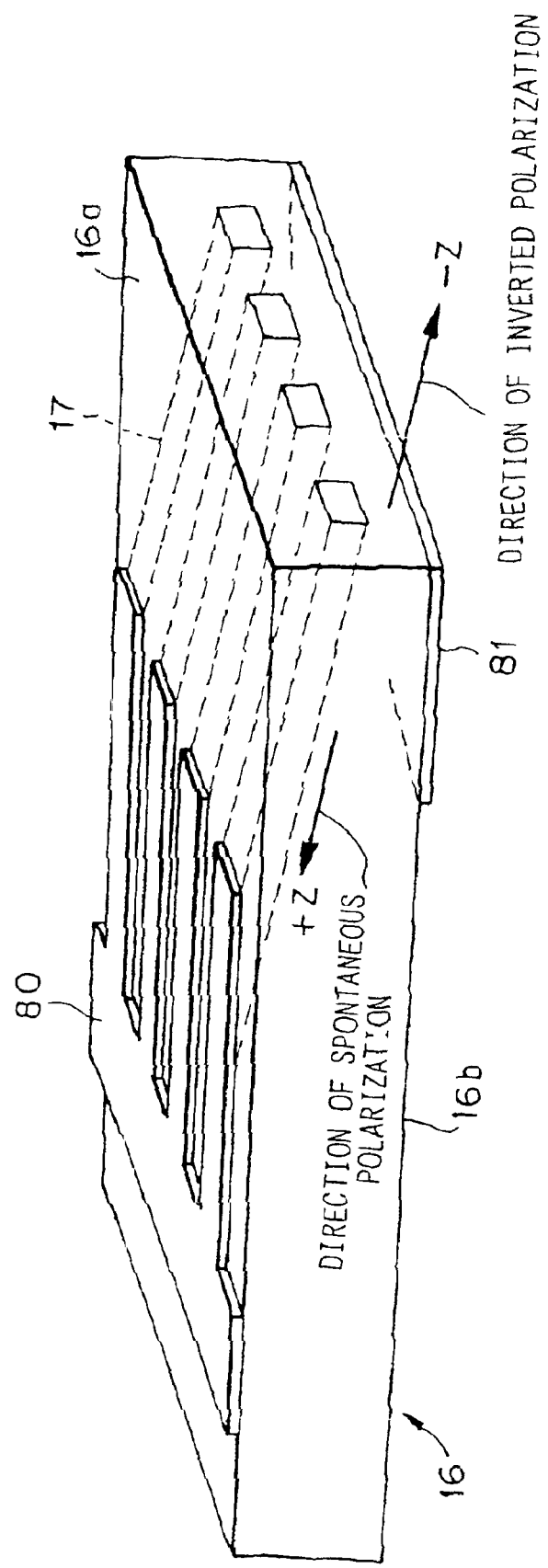
FIG. 6 is an enlarged perspective view of the MgO-LN substrate 16.

In the construction illustrated in FIGS. 4 and 6, the electrodes 80 and 81 are arranged on the opposite surfaces 16a and 16b of the substrate 16 in order to produce the domain-inverted portions 17. Alternatively, when the electrodes 80 and 81 are arranged on only one surface of the substrate 16, deep domain-inverted portions can also be produced as in the case where both of the electrodes 80 and 81 are arranged on the opposite surfaces of the substrate 16. Since the production process is simplified, it is preferable to arrange both of the electrodes 80 and 81 on only one surface of the substrate 16.

Next, the optical channel waveguide 18 is formed in the MgO-LN substrate 16 as follows.

A mask being made of a metal (tantalum in this example) and having a width of 5 to 9 micrometers in the Z' direction is formed by conventional photolithography in the vicinity of the tips of the teeth of the comb electrode 80. The domain inversion is deepest in the vicinity of the tips of the teeth of the comb electrode 80. Thereafter, the MgO-LN substrate 16 is sunk in pyrophosphoric acid, and undergoes a proton exchange process at 160° C. for 64 minutes. Then, the Ta mask is removed by using an etchant, and the MgO-LN substrate 16 is annealed at 350° C. in the atmosphere for an hour. Thus, the optical channel waveguide 18 extending in the direction in which the domain-inverted portions 17 are ranged, as illustrated in FIGS. 1 and 2.

Finally, −X and +X surfaces of the MgO-LN substrate 16 including end facets of the optical channel waveguide 18 are optically polished. Thus, the optical wavelength conversion element 15 is completed.

Referring back to FIG. 1, the laser beam 11 being emitted by the semiconductor laser element 100 and having a center wavelength of 946 nm is collected by the condenser lens 13 so that the laser beam 11 is converged on the end facet 18a of the optical channel waveguide 18. Thus, the laser beam 11 as a fundamental harmonic enters the optical channel waveguide 18. Then, the laser beam 11 propagates in the optical channel waveguide 18 in a TE mode, and phase matching (so-called quasi phase matching) occurs in the periodic domain-inverted region. Thus, a portion of the laser beam 11 is converted into the second harmonic 19 having a (blue) wavelength of 473 nm, which is one-half the center wavelength of the laser beam 11. The second harmonic 19 also propagates through the optical channel waveguide 18 in a guided mode, and exits from the end facet 18b of the optical channel waveguide 18.

The remaining (unconverted) portion of the laser beam 11, which propagates through the optical channel waveguide 18, and is not converted to the second harmonic 19, also exits from the end facet 18b of the optical channel waveguide 18 as divergent light. Both of the unconverted portion of the laser beam 11 and the second harmonic 19 are collimated by the collimator lens 20. The second harmonic 19 is separated from the unconverted portion of the laser beam 11 by a band-pass filter, dichroic mirror, or the like (not shown) so that users can utilize the second harmonic 19 for various purposes.

In the above semiconductor laser module, the direction of the spontaneous polarization of the MgO-LN substrate 16, i.e., the direction of the Z axis, is not perpendicular to the surface 16a of the MgO-LN substrate 16. Therefore, even when the laser beam 11 emitted from the semiconductor laser element 100 enters the optical channel waveguide 18 so that the direction of the linear polarization (indicated by the arrow Q in FIG. 2) is parallel to the surface 16a, the nonlinear optical coefficient $d_{33}$ can be utilized, and therefore the wavelength conversion is enabled. In this case, the output beam profile (pattern) of the laser beam 11 matches the propagated beam profile (pattern). Therefore, the laser beam 11 can enter the optical channel waveguide 18 with a high efficiency. Thus, the intensity of the second harmonic 19 generated in the optical channel waveguide 18 increases. The laser beam 11 propagates through the optical channel waveguide 18 in a TE mode. At this time, the effective nonlinear optical coefficient becomes $d_{33}\cos\theta$.

In the above construction, the normalized efficiency in the wavelength conversion is 180%/Wcm$^2$, as reported in the Technical Digest of the Fourth Microoptics Conference and the Eleventh Topical Meeting on Gradient-index Optical Systems, p.154 and the like. That is, the conversion efficiency is remarkably increased, compared with of the normalized efficiencies (typically 55%/W cm$^2$) of the conventional optical wavelength conversion elements in which an optical waveguide and a periodic domain-inverted structure are formed in an X-cut or Y-cut LiTaO$_3$ substrate.

In the first embodiment, a predetermined coating is formed on the end facet 18a of the optical channel waveguide 18 so that a portion of the laser beam 11 having the center wavelength of 946 nm is reflected by the coating. Therefore, the portion of the laser beam 11 reflected at the end facet 18a is fed back to the semiconductor laser element 100. That is, in the semiconductor laser module as the first embodiment of the present invention, an external resonator for the semiconductor laser element 100 is realized between the end facet 18a of the optical channel waveguide 18 and the backward-side end facet (the left end facet in FIG. 1) of the semiconductor laser element 100.

In addition, a wavelength of the laser beam 11 is selected by the narrow-band-pass filter 14 arranged in the external resonator. That is, a portion of the laser beam 11 which passes through the narrow-band-pass filter 14 is selected, and the semiconductor laser element 100 oscillates at the wavelength selected by the narrow-band-pass filter 14. Since the selected wavelength varies with the rotation angle (indicated by the arrows A in FIG. 1) of the narrow-band-pass filter 14, the oscillation wavelength of the semiconductor laser element 100 can be selected and locked at such a wavelength as to phase-match with the period of the periodic domain-inverted structure, by appropriately setting the rotation angle of the narrow-band-pass filter 14.

Further, since the thicknesses, 5.6 nm, 6 nm, and 6.4 nm, of the three quantum-well sublayers in the undoped multiple-quantum-well (MQW) active layer 125 in the semiconductor laser element 100 are different, the gain spectra of the quantum-well sublayers are different from each other, where the differences between the gain peaks are about 5 nm. Therefore, the peak width of the overall gain spectrum of the entire MQW active layer 125 is increased by the above difference. Thus, the oscillation wavelength can be selected and locked in a wide wavelength range. When the oscillation wavelength is locked, the semiconductor laser element 100 in this example can oscillate in a single mode with a side-mode suppression ratio of 25 dB or greater.

As described above, the peak width of the overall gain spectrum of the entire MQW active layer 125 is increased by arranging the thickness of at least one of the plurality of quantum-well sublayers in the MQW active layer 125 differently from the thicknesses of the other quantum-well sublayers. Alternatively, the peak width of the overall gain spectrum of the entire MQW active layer 125 can be increased by arranging the chemical composition (or both of the thickness and the chemical composition) of at least one of the plurality of quantum-well sublayers in the MQW active layer 125 differently from the chemical compositions (or both of the thicknesses and the chemical compositions) of the other quantum-well sublayers.

Second Embodiment

Figure 7:
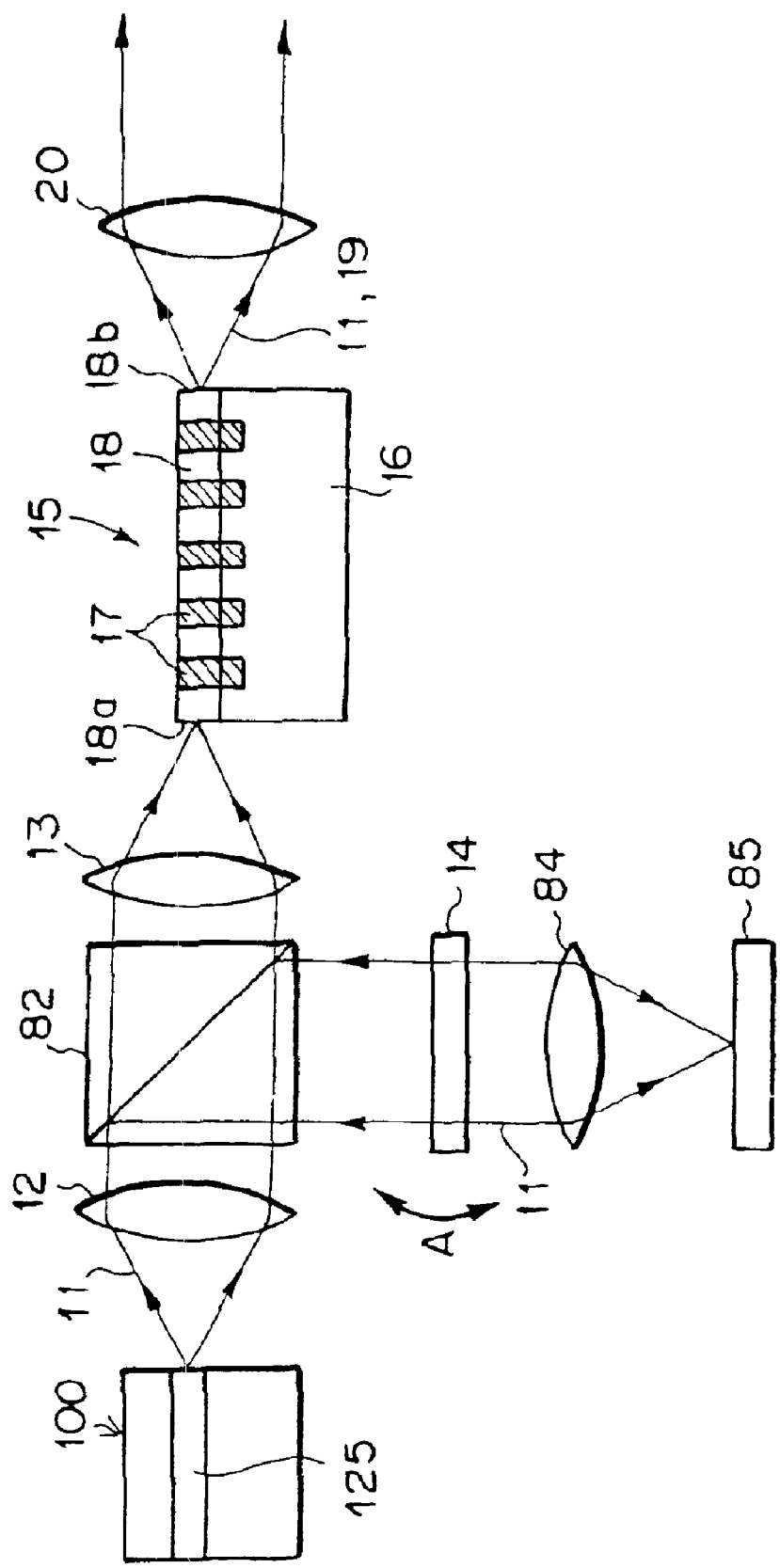
FIG. 7 is a side view of the construction of the second embodiment of the semiconductor laser module according to the present invention.

FIG. 7 is a side view of the construction of the second embodiment of the semiconductor laser module according to the present invention.

In the construction of FIG. 7, a beam splitter 82 is arranged between the collimator lens 12 and the condenser lens 13, so that a portion of the laser beam 11 emitted from the semiconductor laser element 100 is branched off. A narrow-band-pass filter 14, a condenser lens 84, and a mirror 85 are arranged so that the branched-off portion of the laser beam 11 passes through the narrow-band-pass filter 14, and is then collected by the condenser lens 84 so as to converge on the surface of the mirror 85, and be reflected by the mirror 85. The reflected portion of the laser beam 11 retraces the above steps, and fed back to the semiconductor laser element 100. That is, an external resonator for the semiconductor laser element 100 is realized between the mirror 85 and the backward-side end facet (the left end facet in FIG. 7) of the semiconductor laser element 100.

Since a wavelength of the laser beam 11 is selected by the narrow-band-pass filter 14 arranged in the external resonator, the semiconductor laser element 100 oscillates at the wavelength selected by the narrow-band-pass filter 14. The selected wavelength varies with the rotation angle (indicated by the arrows A in FIG. 7) of the narrow-band-pass filter 14. Therefore, the oscillation wavelength of the semiconductor laser element 100 can be selected and locked at such a wavelength as to phase-match with the period of the periodic domain-inverted structure, by appropriately setting the rotation angle of the narrow-band-pass filter 14.

Third Embodiment

Figure 8:
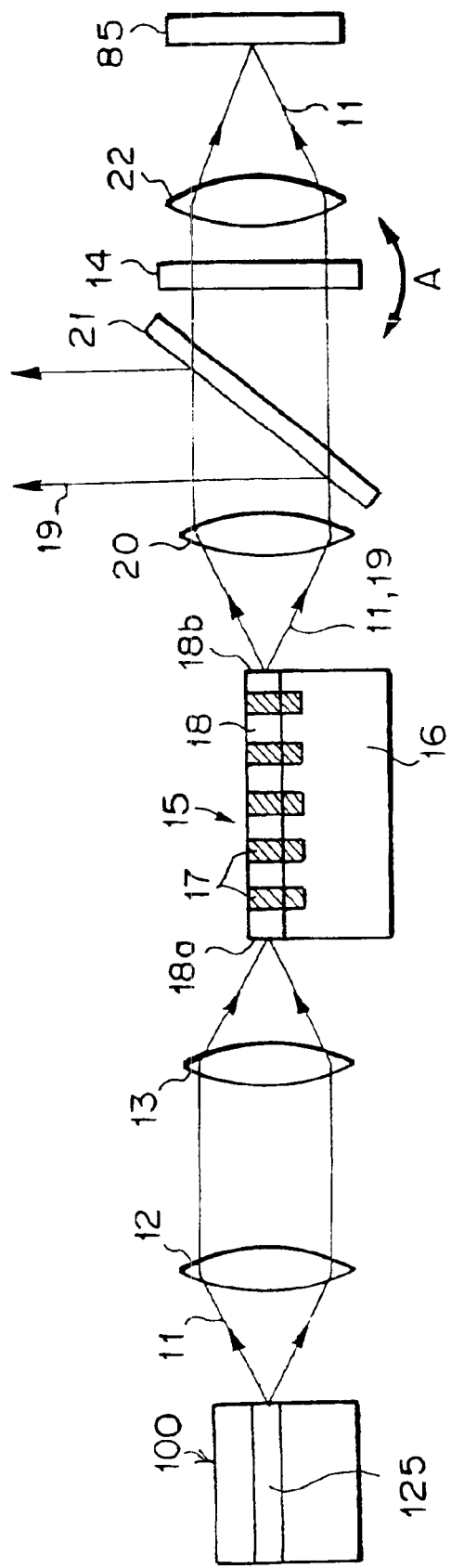
FIG. 8 is a side view of the construction of the third embodiment of the semiconductor laser module according to the present invention.

FIG. 8 is a side view of the construction of the third embodiment of the semiconductor laser module according to the present invention.

In the construction of FIG. 8, a dichroic mirror 21, a narrow-band-pass filter 14, a condenser lens 22, and a mirror 85 are arranged on the forward side of the collimator lens 20, as illustrated in FIG. 8. In the construction of FIG. 8, the aforementioned unconverted portion of the laser beam 11 is collimated by the collimator lens 20, passes through the dichroic mirror 21 and the narrow-band-pass filter 14, and is then collected by the condenser lens 84 so as to converge on the surface of the mirror 85, and be reflected by the mirror 85. The reflected portion of the laser beam 11 retraces the above steps, and fed back to the semiconductor laser element 100. That is, an external resonator for the semiconductor laser element 100 is realized between the mirror 85 and the backward-side end facet (the left end facet in FIG. 8) of the semiconductor laser element 100. On the other hand, the second harmonic 19 generated by the MgO-LN substrate 16 is separated from the unconverted portion of the laser beam 11 by the dichroic mirror 21 so that users can utilize the second harmonic 19 for various purposes.

Similar to the first and second embodiments, the oscillation wavelength of the semiconductor laser element 100 can be selected and locked at such a wavelength as to phase-match with the period of the periodic domain-inverted structure, by appropriately setting the rotation angle (indicated by the arrows A in FIG. 8) of the narrow-band-pass filter 14.

Fourth Embodiment

Figure 9:
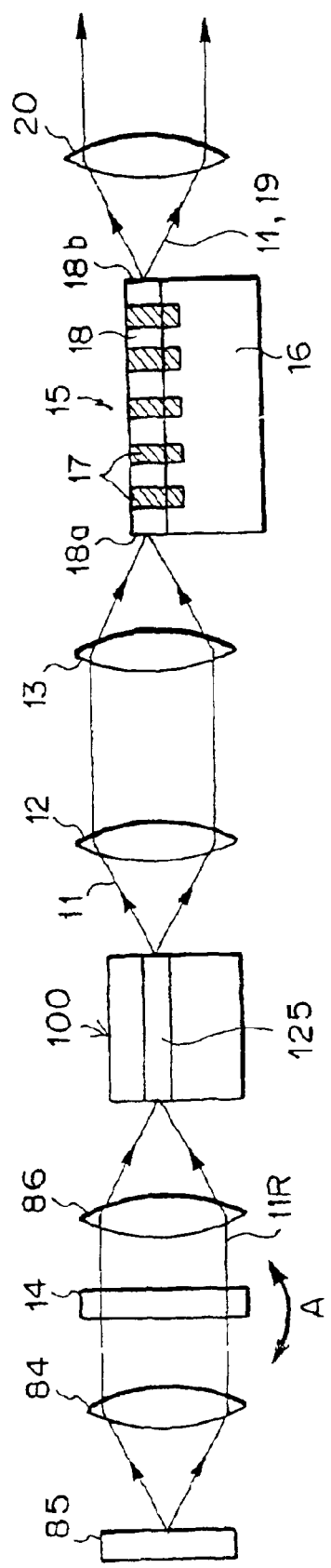
FIG. 9 is a side view of the construction of the fourth embodiment of the semiconductor laser module according to the present invention.

FIG. 9 is a side view of the construction of the fourth embodiment of the semiconductor laser module according to the present invention.

In the construction of FIG. 9, a mirror 85, a condenser lens 84, a narrow-band-pass filter 14, and a collimator lens 86 are arranged on the backward side of the semiconductor laser element 100, as illustrated in FIG. 9. In the construction of FIG. 9, a backward laser beam 11R, which is emitted backward from the semiconductor laser element 100, is collimated by the collimator lens 86, passes the narrow-band-pass filter 14, and is collected by the condenser lens 84 so as to converge on the surface of the mirror 85, and be reflected by the mirror 85. The reflected backward laser beam 11R retraces the above steps, and fed back to the semiconductor laser element 100. That is, an external resonator for the semiconductor laser element 100 is realized between the mirror 85 and the forward-side end facet (the right end facet in FIG. 9) of the semiconductor laser element 100.

In addition, a wavelength of the backward laser beam 11R is selected by the narrow-band-pass filter 14 arranged in the external resonator. The semiconductor laser element 100 oscillates at the wavelength selected by the narrow-band-pass filter 14. Since the selected wavelength varies with the rotation angle (indicated by the arrows A in FIG. 9) of the narrow-band-pass filter 14, the oscillation wavelength of the semiconductor laser element 100 can be selected and locked at such a wavelength as to phase-match with the period of the periodic domain-inverted structure, by appropriately setting the rotation angle of the narrow-band-pass filter 14.

Fifth Embodiment

Figure 10:
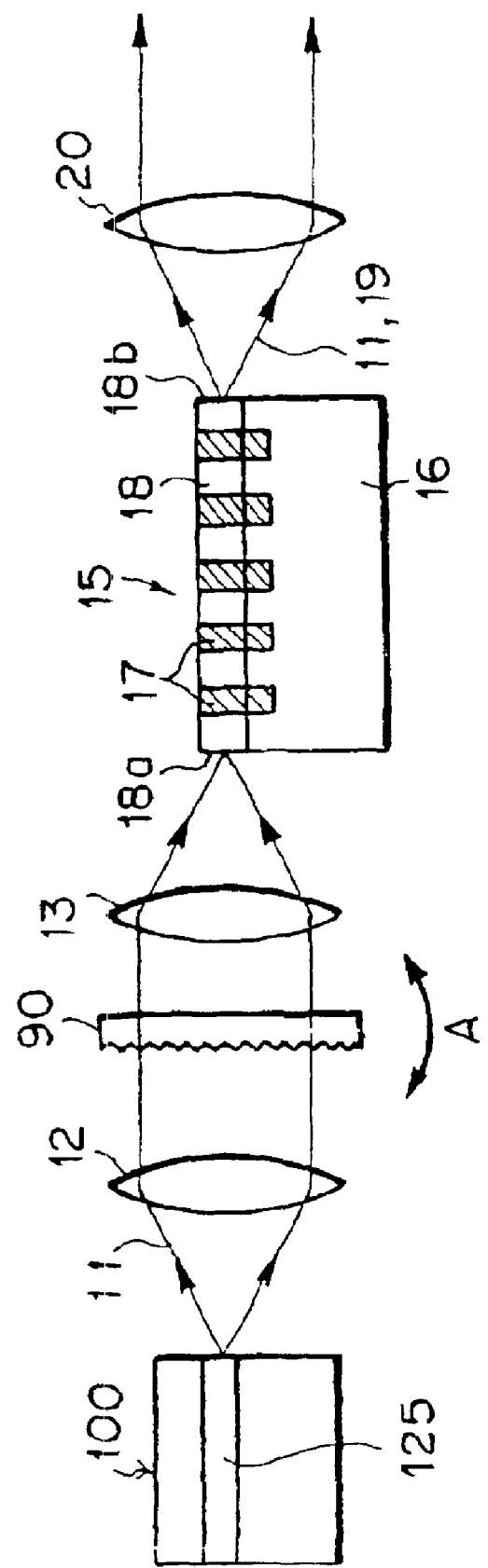
FIG. 10 is a side view of the construction of the fifth embodiment of the semiconductor laser module according to the present invention.

FIG. 10 is a side view of the construction of the fifth embodiment of the semiconductor laser module according to the present invention.

The semiconductor laser module as the fifth embodiment is identical to the semiconductor laser module as the first embodiment (illustrated in FIG. 1) except that a transparent-type bulk grating 90, instead of the narrow-band-pass filter 14, is arranged between the collimator lens 12 and the condenser lens 13. The transparent-type bulk grating 90 also functions as an optical wavelength selection element. The oscillation wavelength of the semiconductor laser element 100 can be selected and locked at such a wavelength as to phase-match with the period of the periodic domain-inverted structure, by appropriating setting the rotation angle (indicated by the arrows A in FIG. 10) of the transparent-type bulk grating 90.

In addition, the narrow-band-pass filter 14 in each of the semiconductor laser modules as the second to fourth embodiments can be replaced with a transparent-type bulk grating. The operations and advantages of the semiconductor laser modules as the second to fourth embodiments are not changed even when the transparent-type bulk grating is used.

Sixth Embodiment

Figure 11:
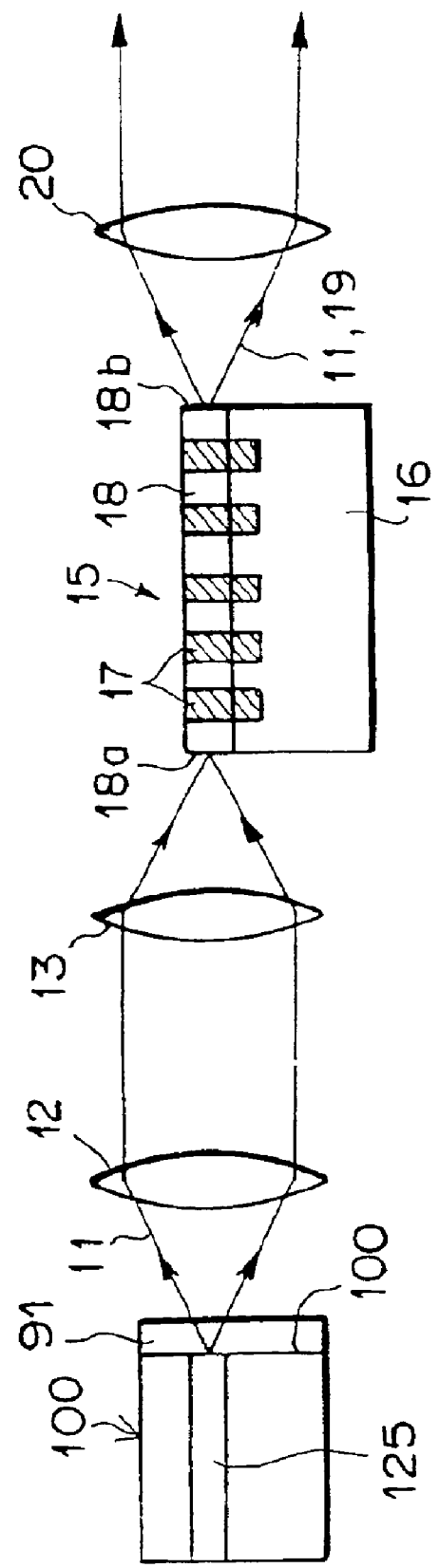
FIG. 11 is a side view of the construction of the sixth embodiment of the semiconductor laser module according to the present invention.

FIG. 11 is a side view of the construction of the sixth embodiment of the semiconductor laser module according to the present invention.

The semiconductor laser module as the sixth embodiment is identical to the semiconductor laser module as the first embodiment (illustrated in FIG. 1) except that a transparent-type thin-film narrow-band-pass filter 91 is formed on the light-exit end facet 100a of the semiconductor laser element 100, instead of arranging the narrow-band-pass filter 14 between the collimator lens 12 and the condenser lens 13. The transparent-type thin-film narrow-band-pass filter 91 allows selective passage of light having a wavelength corresponding to the construction of the thin films constituting the transparent-type thin-film narrow-band-pass filter 91. Since the transparent-type thin-film narrow-band-pass filter 91 is arranged in an external resonator realized between the end facet 18a of the optical channel waveguide 18 and the backward-side end facet (the left end facet in FIG. 11) of the semiconductor laser element 100, the oscillation wavelength of the semiconductor laser element 100 can be selected and locked at such a wavelength as to phase-match with the period of the periodic domain-inverted structure.

Seventh Embodiment

Figure 12:
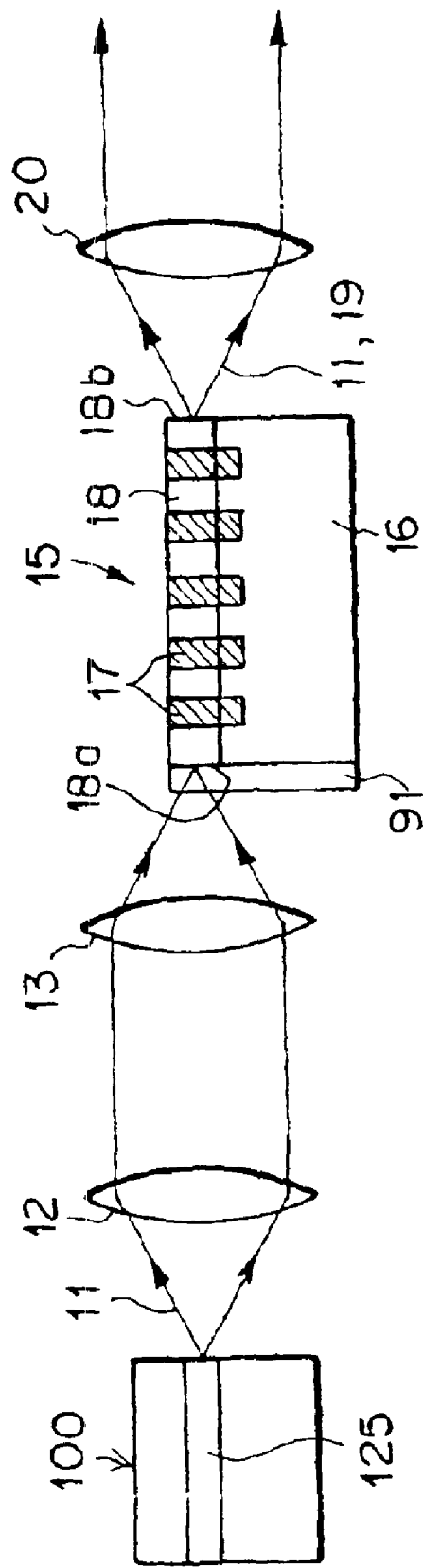
FIG. 12 is a side view of the construction of the seventh embodiment of the semiconductor laser module according to the present invention.

FIG. 12 is a side view of the construction of the seventh embodiment of the semiconductor laser module according to the present invention.

The semiconductor laser module as the seventh embodiment is identical to the semiconductor laser module as the sixth embodiment (illustrated in FIG. 11) except that the transparent-type thin-film narrow-band-pass filter 91 is formed on the backward-side end facet of the optical wavelength conversion element 15 including the end facet 18a of the optical channel waveguide 18 instead of forming the transparent-type thin-film narrow-band-pass filter 91 on the light-exit end facet 100a of the semiconductor laser element 100. Since the transparent-type thin-film narrow-band-pass filter 91 is arranged in an external resonator realized between the end facet 18a of the optical channel waveguide 18 and the backward-side end facet (the left end facet in FIG. 12) of the semiconductor laser element 100, the oscillation wavelength of the semiconductor laser element 100 can be selected and locked at such a wavelength as to phase-match with the period of the periodic domain-inverted structure.

Eighth Embodiment

Figure 13:
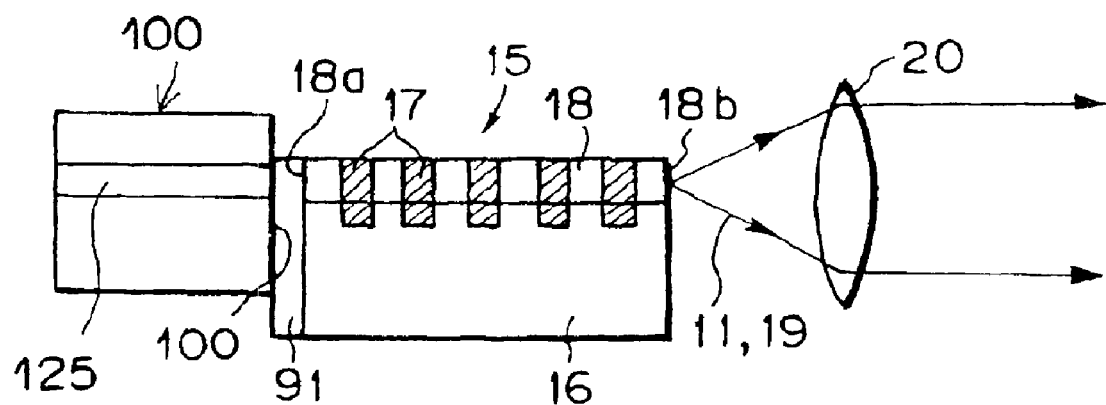
FIG. 13 is a side view of the construction of the eighth embodiment of the semiconductor laser module according to the present invention.

FIG. 13 is a side view of the construction of the eighth embodiment of the semiconductor laser module according to the present invention.

The semiconductor laser module as the eighth embodiment is identical to the semiconductor laser module as the seventh embodiment (illustrated in FIG. 12) except that the collimator lens 12 and the condenser lens 13 are removed, and the light-exit end facet 100a of the semiconductor laser element 100 is directly coupled to backward-side end facet of the optical wavelength conversion element 15 including the end facet 18a of the optical channel waveguide 18 through the transparent-type thin-film narrow-band-pass filter 91. Since the transparent-type thin-film narrow-band-pass filter 91 is arranged in an external resonator realized between the end facet 18a of the optical channel waveguide 18 and the backward-side end facet (the left end facet in FIG. 13) of the semiconductor laser element 100, the oscillation wavelength of the semiconductor laser element 100 can be selected and locked at such a wavelength as to phase-match with the period of the periodic domain-inverted structure.

In the semiconductor laser module as the eighth embodiment of the present invention, the optical system which couples the fundamental harmonic to the optical wavelength conversion element 15 is dispensed with. That is, the semiconductor laser module as the eighth embodiment has a simple construction, and optical adjustment of the semiconductor laser module as the eighth embodiment is very easy.

Alternatively, the transparent-type thin-film narrow-band-pass filter 91 can be formed on another end facet such as the forward-side end facet of the optical wavelength conversion element 15 including the end facet 18b of the optical channel waveguide 18.

Further, in semiconductor laser modules in which the semiconductor laser element 100 is coupled to the optical wavelength conversion element 15, the wavelength selection can be achieved in a manner other than the provision of the transparent-type thin-film narrow-band-pass filter 91. For example, in the semiconductor laser module as the third embodiment (FIG. 8), it is possible to remove the collimator lens 12 and the condenser lens 13, and directly couple the semiconductor laser element 100 with the optical wavelength conversion element 15.

Ninth Embodiment

Figure 14:
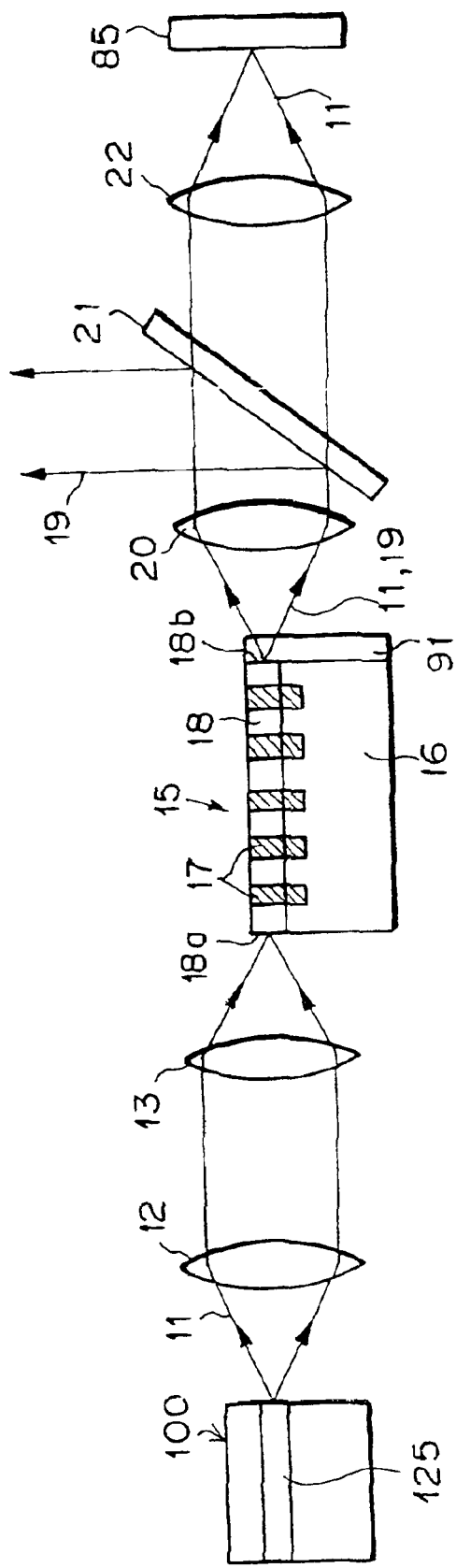
FIG. 14 is a side view of the construction of the ninth embodiment of the semiconductor laser module according to the present invention.

FIG. 14 is a side view of the construction of the ninth embodiment of the semiconductor laser module according to the present invention.

The semiconductor laser module as the ninth embodiment is identical to the semiconductor laser module as the third embodiment (illustrated in FIG. 8) except that a transparent-type thin-film narrow-band-pass filter 91 is formed on the forward-side end facet of the optical wavelength conversion element 15 including the end facet 18b of the optical channel waveguide 18, instead of arranging the narrow-band-pass filter 14 between the collimator lens 12 and the condenser lens 13.

Since the transparent-type thin-film narrow-band-pass filter 91 is arranged in an external resonator for the semiconductor laser element 100, which is realized between the mirror 85 and the backward-side end facet (the left end facet in FIG. 14) of the semiconductor laser element 100, the oscillation wavelength of the semiconductor laser element 100 can be selected and locked at such a wavelength as to phase-match with the period of the periodic domain-inverted structure.

Tenth Embodiment

Figure 15:
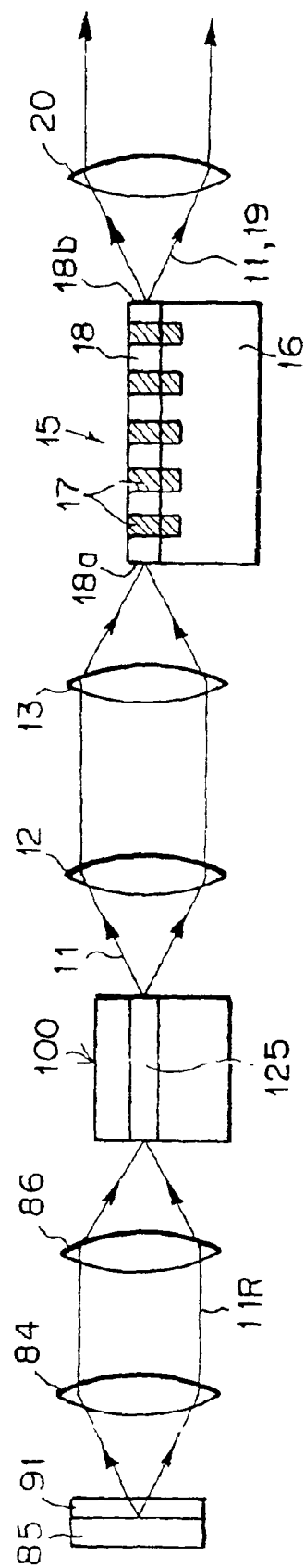
FIG. 15 is a side view of the construction of the tenth embodiment of the semiconductor laser module according to the present invention.

FIG. 15 is a side view of the construction of the tenth embodiment of the semiconductor laser module according to the present invention.

The semiconductor laser module as the tenth embodiment is identical to the semiconductor laser module as the fourth embodiment (illustrated in FIG. 9) except that a transparent-type thin-film narrow-band-pass filter 91 is formed on the reflection surface of the mirror 85, instead of arranging the narrow-band-pass filter 14 between the collimator lens 12 and the condenser lens 13.

Since the transparent-type thin-film narrow-band-pass filter 91 is arranged in an external resonator for the semiconductor laser element 100, which is realized between the mirror 85 and the forward-side end facet (the right end facet in FIG. 15) of the semiconductor laser element 100, the oscillation wavelength of the semiconductor laser element 100 can be selected and locked at such a wavelength as to phase-match with the period of the periodic domain-inverted structure.

In addition, it is possible to use a transparent-type thin-film narrow-band-pass filter 91 in the semiconductor laser module as the second embodiment (illustrated in FIG. 7), instead of arranging the narrow-band-pass filter 14 between the beam splitter 82 and the condenser lens 84. In this case, the transparent-type thin-film narrow-band-pass filter 91 can be formed on the reflection surface of the mirror 85 or the forward-side end facet (the right end facet in FIG. 7) of the semiconductor laser element 100.

Eleventh Embodiment

Figure 16:
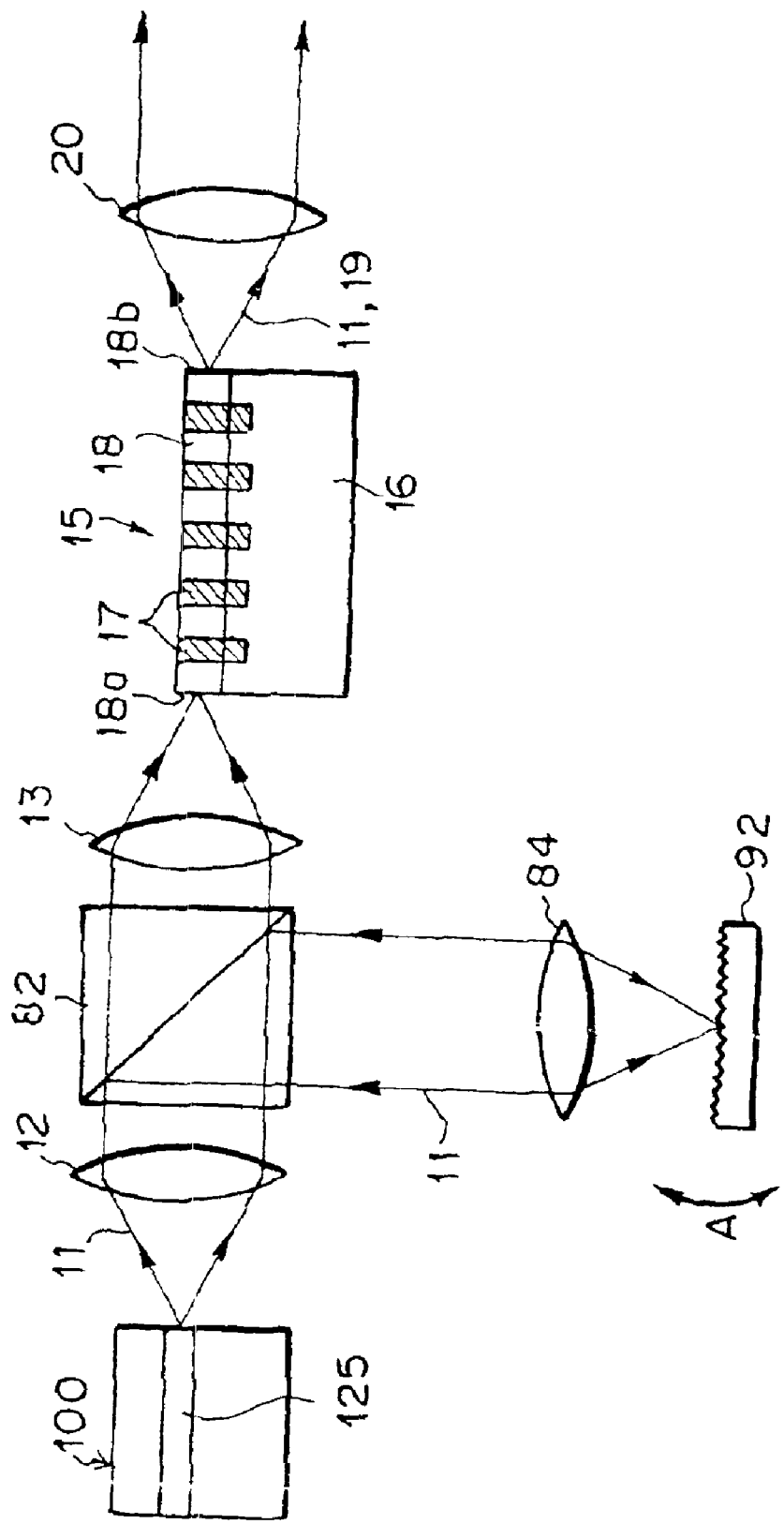
FIG. 16 is a side view of the construction of the eleventh embodiment of the semiconductor laser module according to the present invention.

FIG. 16 is a side view of the construction of the eleventh embodiment of the semiconductor laser module according to the present invention.

The semiconductor laser module as the eleventh embodiment is identical to the semiconductor laser module as the second embodiment (illustrated in FIG. 7) except that a reflection-type bulk grating 92 is arranged instead of the mirror 85, and the narrow-band-pass filter 14 is removed.

The reflection-type bulk grating 92 reflects a portion of the laser beam 11 which is incident on the reflection-type bulk grating 92. That is, an external resonator for the semiconductor laser element 100 is realized between the reflection-type bulk grating 92 and the backward-side end facet (the left end facet in FIG. 16) of the semiconductor laser element 100. Since the reflection-type bulk grating 92 functions as an optical wavelength selection element, the oscillation wavelength of the semiconductor laser element 100 can be selected and locked at such a wavelength as to phase-match with the period of the periodic domain-inverted structure, by appropriating setting the rotation angle (indicated by the arrows A in FIG. 16) of the reflection-type bulk grating 92.

Twelfth Embodiment

Figure 17:
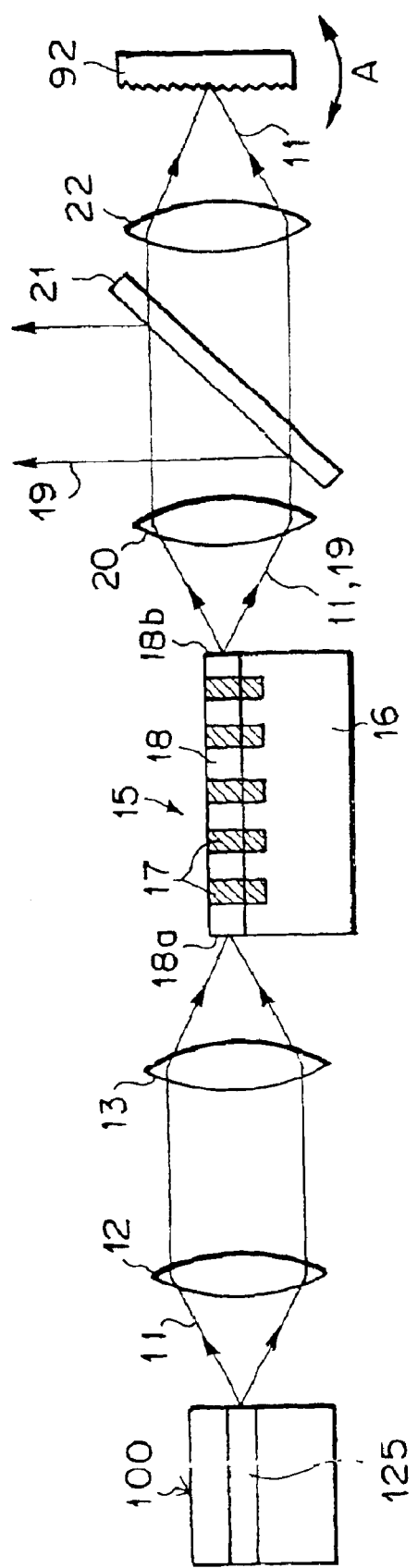
FIG. 17 is a side view of the construction of the twelfth embodiment of the semiconductor laser module according to the present invention.

FIG. 17 is a side view of the construction of the twelfth embodiment of the semiconductor laser module according to the present invention.

The semiconductor laser module as the twelfth embodiment is identical to the semiconductor laser module as the third embodiment (illustrated in FIG. 8) except that a reflection-type bulk grating 92 is arranged instead of the mirror 85, and the narrow-band-pass filter 14 is removed.

The reflection-type bulk grating 92 reflects a portion of the laser beam 11 which is incident on the reflection-type bulk grating 92. That is, an external resonator for the semiconductor laser element 100 is realized between the reflection-type bulk grating 92 and the backward-side end facet (the left end facet in FIG. 17) of the semiconductor laser element 100. Since the reflection-type bulk grating 92 functions as an optical wavelength selection element, the oscillation wavelength of the semiconductor laser element 100 can be selected and locked at such a wavelength as to phase-match with the period of the periodic domain-inverted structure, by appropriating setting the rotation angle (indicated by the arrows A in FIG. 17) of the reflection-type bulk grating 92.

Thirteenth Embodiment

Figure 18:
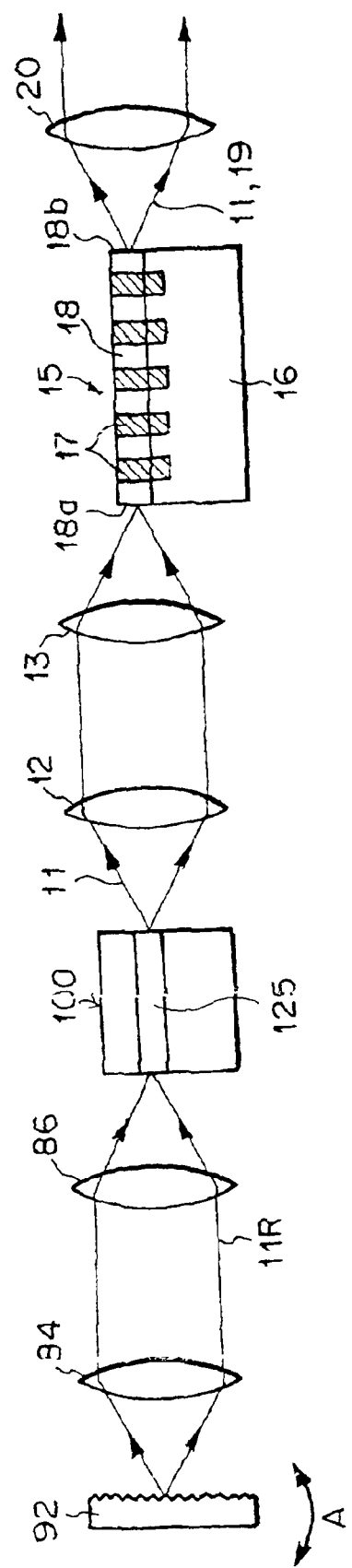
FIG. 18 is a side view of the construction of the thirteenth embodiment of the semiconductor laser module according to the present invention.

FIG. 18 is a side view of the construction of the thirteenth embodiment of the semiconductor laser module according to the present invention.

The semiconductor laser module as the thirteenth embodiment is identical to the semiconductor laser module as the fourth embodiment (illustrated in FIG. 9) except that a reflection-type bulk grating 92 is arranged instead of the mirror 85, and the narrow-band-pass filter 14 is removed.

The reflection-type bulk grating 92 reflects a portion of the laser beam 11 which is incident on the reflection-type bulk grating 92. That is, an external resonator for the semiconductor laser element 100 is realized between the reflection-type bulk grating 92 and the forward-side end facet (the right end facet in FIG. 18) of the semiconductor laser element 100. Since the reflection-type bulk grating 92 functions as an optical wavelength selection element, the oscillation wavelength of the semiconductor laser element 100 can be selected and locked at such a wavelength as to phase-match with the period of the periodic domain-inverted structure, by appropriating setting the rotation angle (indicated by the arrows A in FIG. 18) of the reflection-type bulk grating 92.

Fourteenth Embodiment

In the above constructions using the reflection-type bulk grating 92, the reflection-type bulk grating 92 can be replaced with a reflection-type thin-film narrow-band-pass filter.

Figure 19:
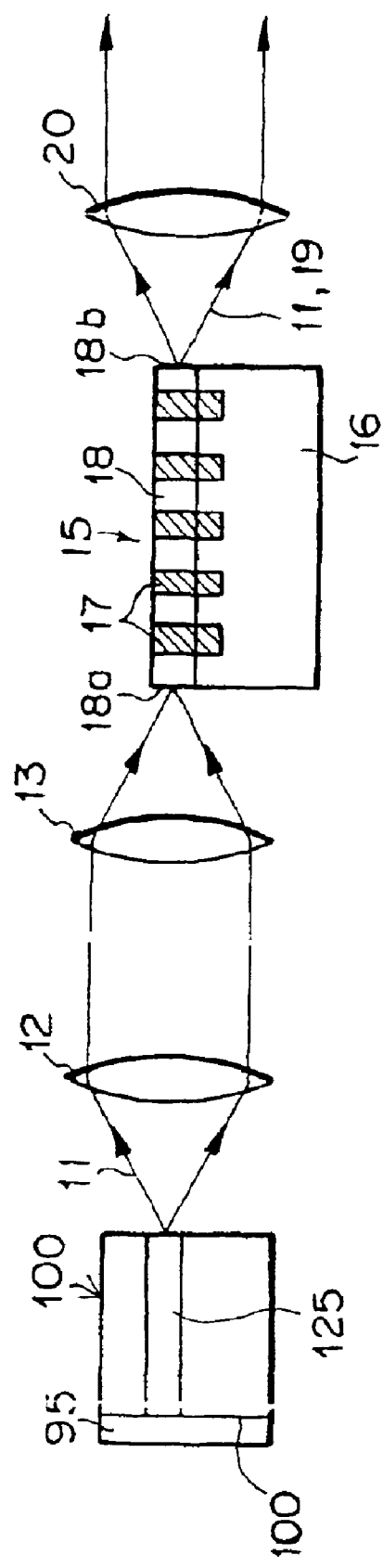
FIG. 19 is a side view of the construction of the fourteenth embodiment of the semiconductor laser module according to the present invention.

FIG. 19 is a side view of the construction of the fourteenth embodiment of the semiconductor laser module according to the present invention.

The semiconductor laser module as the fourteenth embodiment is identical to the semiconductor laser module as the thirteenth embodiment (illustrated in FIG. 18) except that the reflection-type bulk grating 92, the condenser lens 84, and the collimator lens 86 are removed, and a reflection-type thin-film narrow-band-pass filter 95 is formed on the backward-side end facet 100$b$ (the left end facet in FIG. 19) of the semiconductor laser element 100.

Further, in the construction of FIG. 19, it is possible to remove the collimator lens 12 and the condenser lens 13, and directly couple the semiconductor laser element 100 to the optical wavelength conversion element 15.

Fifteenth Embodiment

Figure 20:
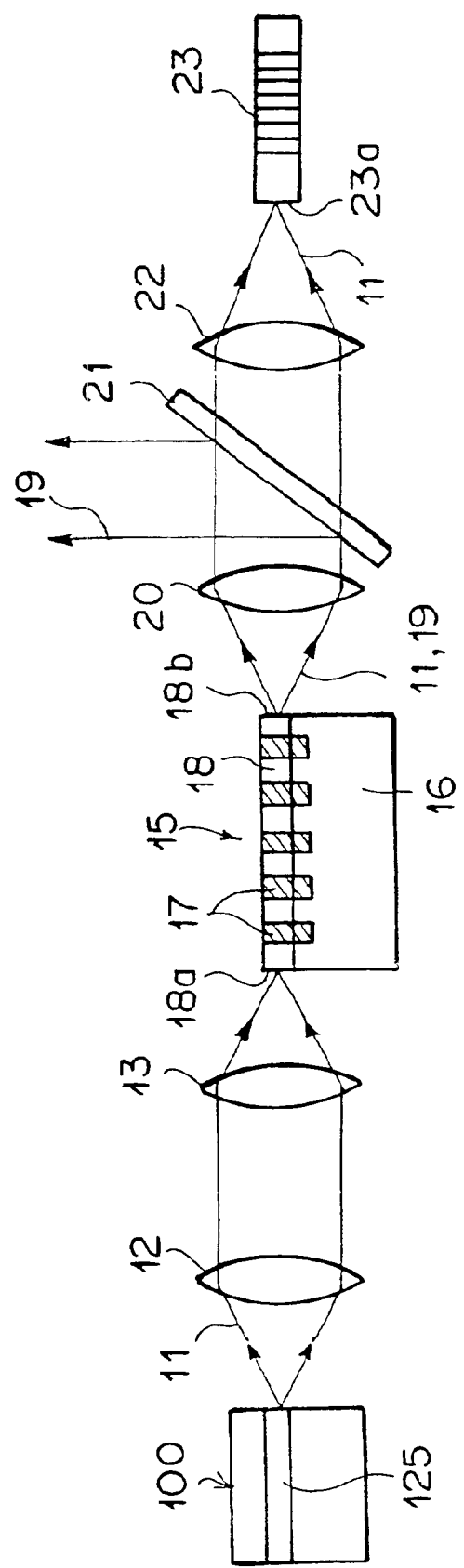
FIG. 20 is a side view of the construction of the fifteenth embodiment of the semiconductor laser module according to the present invention.

FIG. 20 is a side view of the construction of the fifteenth embodiment of the semiconductor laser module according to the present invention.

The semiconductor laser module as the fifteenth embodiment is identical to the semiconductor laser module as the twelfth embodiment (illustrated in FIG. 17) except that a fiber grating 23 is arranged instead of the reflection-type bulk grating 92.

In the construction of FIG. 20, both of the unconverted portion of the laser beam 11 and the second harmonic 19 are collimated by the collimator lens 20. Then, the second harmonic 19 is separated from the unconverted portion of the laser beam 11 by the dichroic mirror 21 so that users can utilize the second harmonic 19 for various purposes. On the other hand, the unconverted portion of the laser beam 11 passes through the dichroic mirror 21 and the narrow-band-pass filter 14, and is then collected by the condenser lens 22 so as to converge on the end surface 23$a$ of the fiber grating 23.

FIG. 21 is a diagram illustrating a portion of the semiconductor laser module of FIG. 20, where the structure of the fiber grating 23 is illustrated. As illustrated in FIG. 21, the fiber grating 23 is an optical fiber comprised of a core 23$c$ and a cladding 23$b$. The cladding 23$b$ surrounds the core 23$c$, and has a smaller refractive index than that of the core 23$c$. In the core 23$c$, a plurality of refractive-index variation portions are formed at regular intervals. For example, the plurality of refractive-index variation portions can be produced in a core of an optical fiber designed for use in communication, by generating two-beam interference fringes of excimer laser light having an ultraviolet wavelength of 248 nm so as to change (increase) refractive indexes of portions exposed to the two-beam interference light, where the diameter of the core is, for example, 10 micrometers, and the outside diameter of a cladding surrounding the core is, for example, 125 micrometers. When the core is doped with germanium dioxide, it is considered that the above change of the refractive index is caused by chemical change of germanium dioxide due to the exposure to the ultraviolet light.

In the semiconductor laser module of FIGS. 20 and 21, the fiber grating 23 is arranged so that the laser beam 11 collected by the condenser lens 22 converges on the backward-side end surface 23a of the fiber grating 23. Thus, the laser beam 11 enters the core 23c of the fiber grating 23, and propagates in the core 23c. The plurality of refractive-index variation portions produced in the core 23c realize a grating formed along the direction of the propagation of the laser beam 11. This grating diffracts and reflects only a portion of the light beam 11 which has a specific wavelength corresponding to the pitch $\Lambda_{FG}$ of the grating, and feeds back the reflected portion of the light beam 11 to the semiconductor laser element 100 through the optical wavelength conversion element 15. That is, an external resonator for the semiconductor laser element 100 is realized between the grating formed in the core 23c of the fiber grating 23 and the backward-side end facet (the left end facet in FIG. 20) of the semiconductor laser element 100. Therefore, the oscillation wavelength of the semiconductor laser element 100 can be selected and locked at such a wavelength as to phase-match with the period of the periodic domain-inverted structure, by appropriating setting the above pitch $\Lambda_{FG}$ of the grating.

Sixteenth Embodiment

Figure 22:
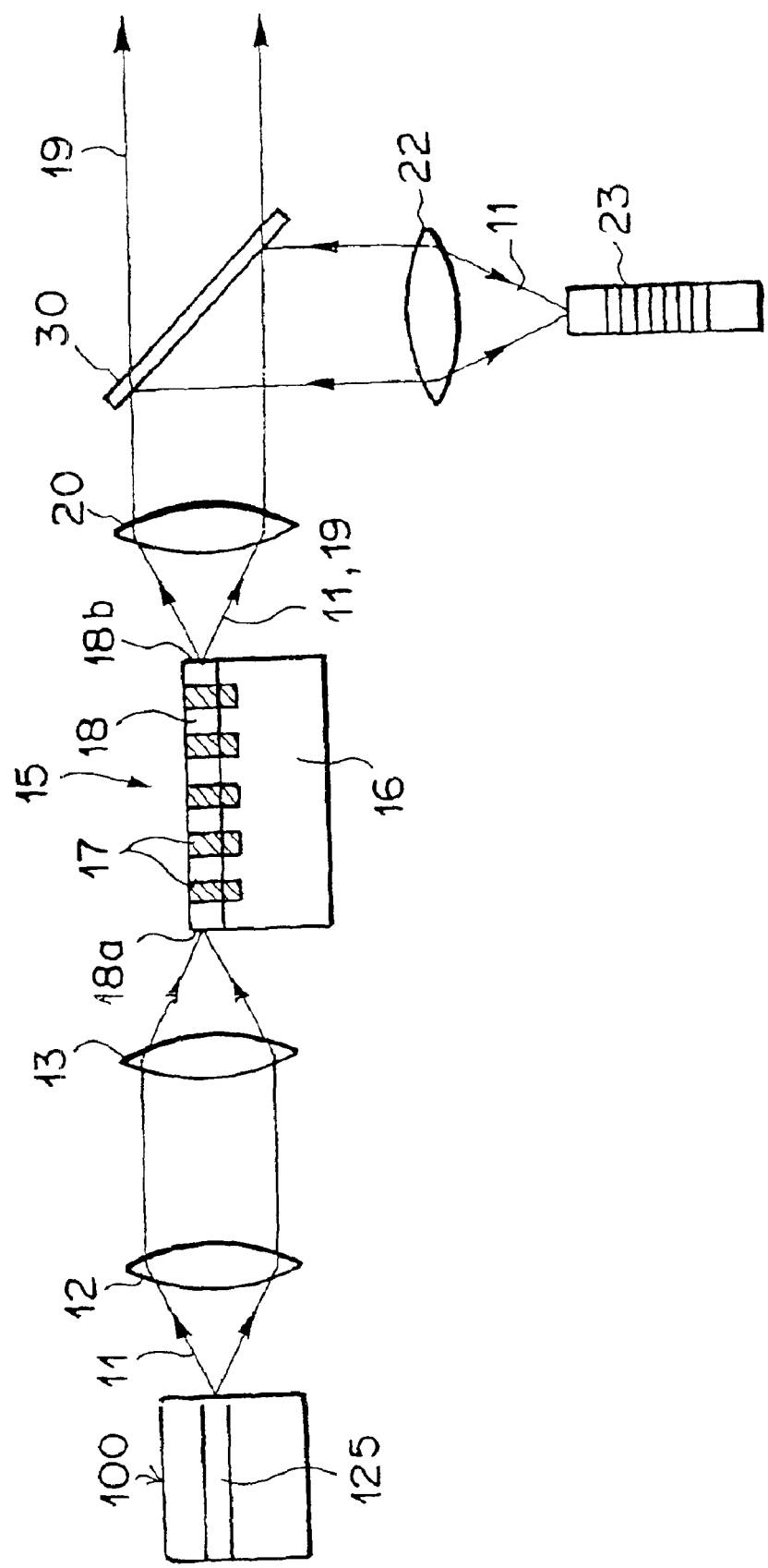
FIG. 22 is a side view of the construction of the sixteenth embodiment of the semiconductor laser module according to the present invention.

FIG. 22 is a side view of the construction of the sixteenth embodiment of the semiconductor laser module according to the present invention.

The semiconductor laser module as the sixteenth embodiment is identical to the semiconductor laser module as the fifteenth embodiment (illustrated in FIG. 20) except that the second harmonic 19 passes through a dichroic mirror 30 so that users can utilize the second harmonic 19 for various purposes, and the aforementioned unconverted portion of the laser beam 11 is reflected by the dichroic mirror 30, and collected by the condenser lens 22 so as to converge on the backward-side end surface of the fiber grating 23.

In the semiconductor laser module of FIG. 22, an external resonator for the semiconductor laser element 100 is realized between the grating formed in the core 23c of the fiber grating 23 and the backward-side end facet (the left end facet in FIG. 22) of the semiconductor laser element 100. Therefore, the semiconductor laser module as the sixteenth embodiment of the present invention has similar advantages to the fifteenth embodiment (illustrated in FIG. 20).

Seventeenth Embodiment

Figure 23:
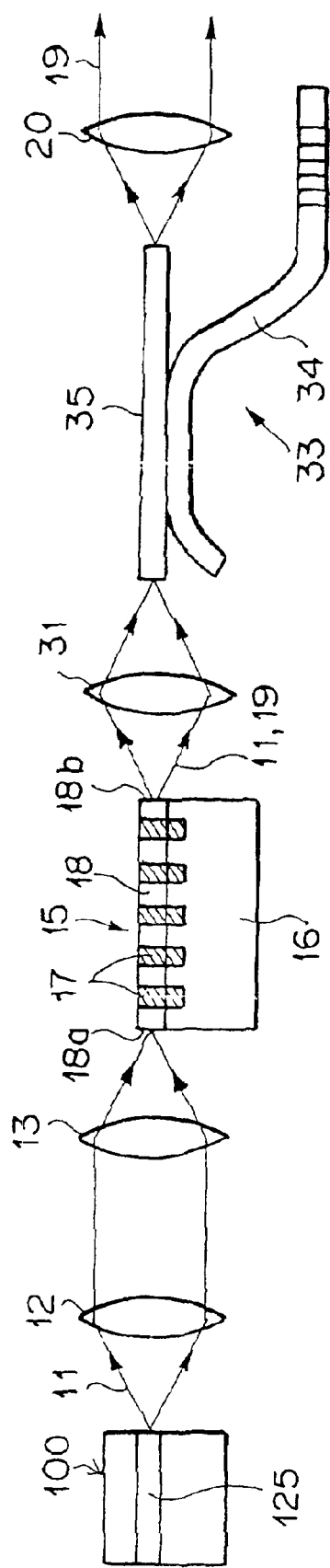
FIG. 23 is a side view of the construction of the seventeenth embodiment of the semiconductor laser module according to the present invention.

FIG. 23 is a side view of the construction of the seventeenth embodiment of the semiconductor laser module according to the present invention.

The semiconductor laser module as the seventeenth embodiment is identical to the semiconductor laser module as the fifteenth embodiment (illustrated in FIG. 20) except that a wavelength-selection fiber coupler 33 including a fiber grating is provided for separating the laser beam 11 from the second harmonic 19. The wavelength-selection fiber coupler 33 is comprised of a first optical fiber 34 and a second optical fiber 35 coupled to the first optical fiber 34. The first optical fiber 34 includes a plurality of refractive-index variation portions which are similar to those included in the fiber grating 23 in the fifteenth embodiment.

In the construction of FIG. 23, both of the aforementioned unconverted portion of the laser beam 11 and the second harmonic 19 are collected by the condenser lens 31, which functions as a convergence optical system. The backward-side end surface of the second optical fiber 35 is arranged so that the unconverted portion of the laser beam 11 and the second harmonic 19 collected by the condenser lens 31 converge on the backward-side end surface of the second optical fiber 35. Thus, the unconverted portion of the laser beam 11 and the second harmonic 19 enter the second optical fiber 35. The second harmonic 19 propagates through the second optical fiber 35, and exits from the forward-side end surface of the second optical fiber 35 as divergent light. Then, the second harmonic 19 is collimated by the collimator lens 20 so that users can utilize the second harmonic 19 for various purposes.

On the other hand, the unconverted portion of the laser beam 11 propagates from the second optical fiber 35 to the first optical fiber 34 through the coupling between the first and second optical fibers 34 and 35. Then, the unconverted portion of the laser beam 11 propagates in the first optical fiber 34, and is diffracted and reflected by the plurality of refractive-index variation portions included in the first optical fiber 34. The diffracted and reflected laser beam 11 is fed back to the semiconductor laser element 100 through the second optical fiber 35 and the optical wavelength conversion element 15. Therefore, the semiconductor laser module as the seventeenth embodiment of the present invention has similar advantages to the fifteenth embodiment (illustrated in FIG. 20).

Alternatively, the above wavelength-selection fiber coupler 33 can be arranged so that both of the aforementioned unconverted portion of the laser beam 11 and the second harmonic 19 first enter the first optical fiber 34, and the second harmonic 19 propagates from the first optical fiber 34 to the second optical fiber 35 through the coupling between the first and second optical fibers 34 and 35.

In the semiconductor laser modules as the fifteenth to seventeenth embodiments, a portion of the fundamental harmonic (the laser beam 11) which is not converted to the second harmonic in the optical wavelength conversion element 15 is diffracted and reflected by a fiber grating. On the other hand, in the eighteenth, nineteenth, and twentieth embodiments, the laser beam 11 is diffracted and reflected before the laser beam 11 enters the optical wavelength conversion element 15, as explained below.

Eighteenth Embodiment

Figure 24:
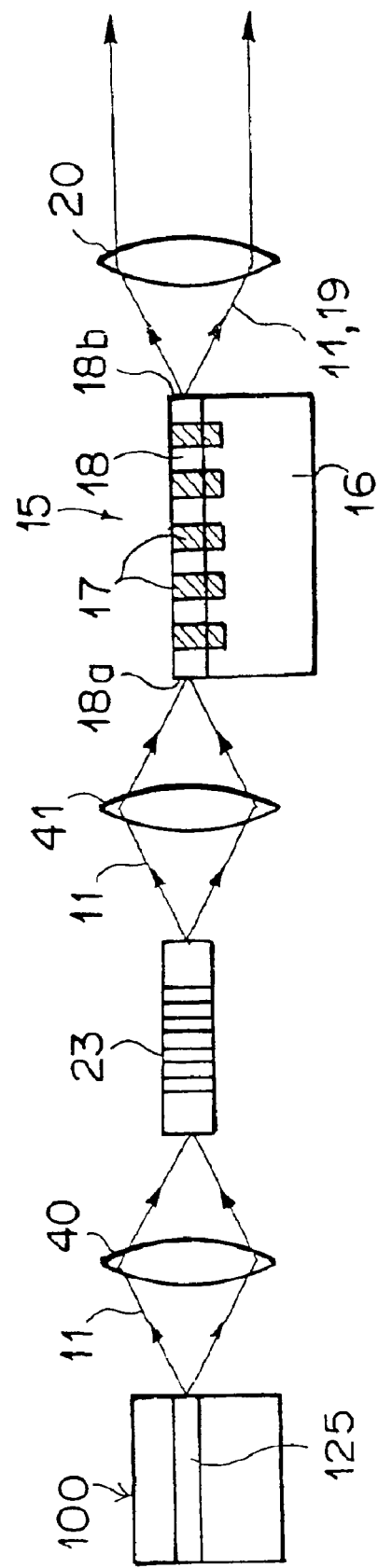
FIG. 24 is a side view of the construction of the eighteenth embodiment of the semiconductor laser module according to the present invention.

FIG. 24 is a side view of the construction of the eighteenth embodiment of the semiconductor laser module according to the present invention.

As illustrated in FIG. 24, in the semiconductor laser module as the eighteenth embodiment of the present invention, the laser beam 11 which exits from the semiconductor laser element 100 as divergent light is collected by the condenser lens 40, which functions as a convergence optical system. A fiber grating 23 is arranged so that the laser beam 11 collected by the condenser lens 40 converges on the backward-side end surface of the fiber grating 23, where the fiber grating 23 in the construction of FIG. 24 is similar to that used in the construction of FIG. 20. Thus, the laser beam 11 enters the fiber grating 23.

A portion of the laser beam 11 which propagates in the fiber grating 23 is diffracted and reflected by the plurality of refractive-index variation portions included in the fiber grating 23. The diffracted and reflected laser beam 11 is fed back to the semiconductor laser element 100 through the condenser lens 40. Therefore, the semiconductor laser module as the eighteenth embodiment of the present invention has similar advantages to the fifteenth embodiment (illustrated in FIG. 20).

On the other hand, the other portion of the laser beam 11 propagates through the fiber grating 23, and exits from the forward-side end surface of the fiber grating 23. Then, this portion of the laser beam 11 is collected by the condenser lens 41, enters an optical channel waveguide 18 in an optical wavelength conversion element 15, and is converted to a second harmonic 19. The second harmonic 19 exits from the optical wavelength conversion element 15 as divergent light, is then collimated by the collimator lens so that users can utilize the second harmonic 19 for various purposes. In order to separate the second harmonic 19 from the laser beam 11, one of the aforementioned techniques can be used as appropriate.

Nineteenth Embodiment

Figure 25:
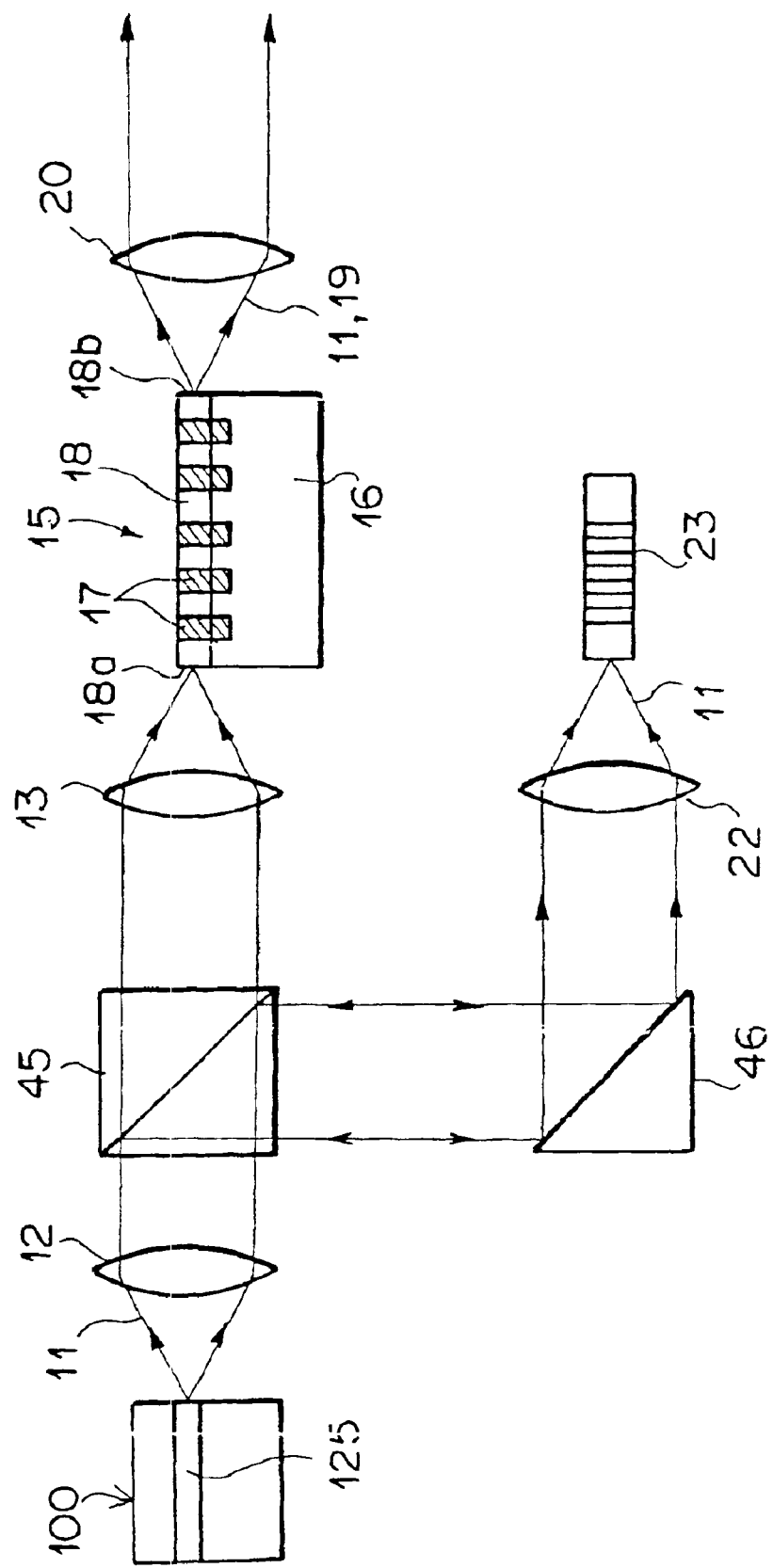
FIG. 25 is a side view of the construction of the nineteenth embodiment of the semiconductor laser module according to the present invention.

FIG. 25 is a side view of the construction of the nineteenth embodiment of the semiconductor laser module according to the present invention.

As illustrated in FIG. 25, in the semiconductor laser module as the nineteenth embodiment of the present invention, the laser beam 11 which exits from the semiconductor laser element 100 as divergent light is collimated by the collimator lens 12, and split into two portions by the beam splitter 45. The first portion of the laser beam 11 passes through the beam splitter 45, and lead to the optical wavelength conversion element 15 in a similar manner to the fifteenth embodiment (illustrated in FIG. 20). On the other hand, the second portion of the laser beam 11 is reflected by the beam splitter 45 and the mirror 46, and collected by the condenser lens 22 so as to enter the fiber grating 23. Then, the second portion of the laser beam 11 propagates in the fiber grating 23, and is diffracted and reflected by the plurality of refractive-index variation portions included in the fiber grating 23.

The diffracted and reflected portion of the laser beam 11 is fed back to the semiconductor laser element 100 through the mirror 46, the beam splitter 45, and the like. Therefore, the semiconductor laser module as the nineteenth embodiment of the present invention has similar advantages to the fifteenth embodiment (illustrated in FIG. 20).

In this embodiment, the collimator lens 12 and the condenser lens 13 constitute a convergence optical system which converges the laser beam 11 on the backward-side end facet of the optical wavelength conversion element 15.

Twentieth Embodiment

Figure 26:
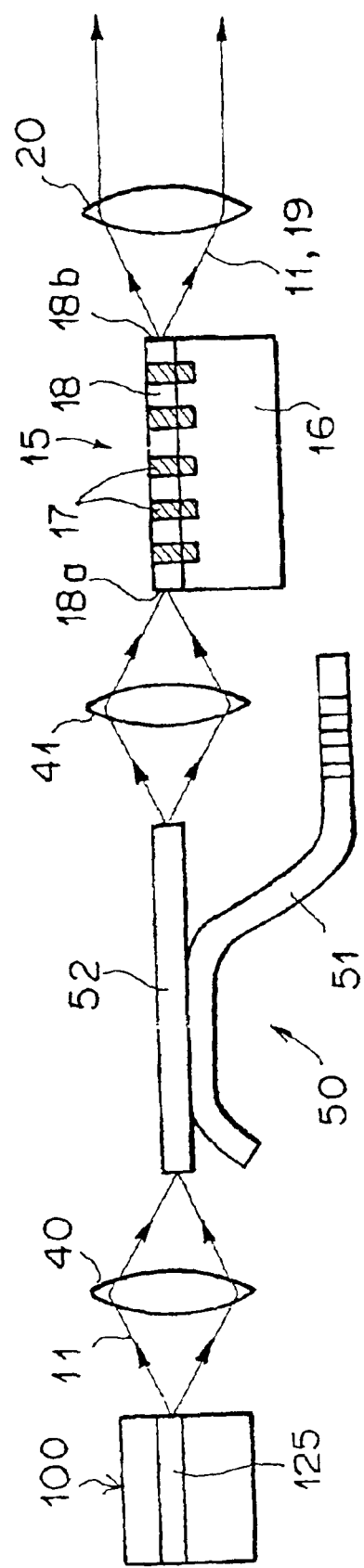
FIG. 26 is a side view of the construction of the twentieth embodiment of the semiconductor laser module according to the present invention.

FIG. 26 is a side view of the construction of the twentieth embodiment of the semiconductor laser module according to the present invention.

The semiconductor laser module as the twentieth embodiment is identical to the semiconductor laser module as the eighteenth embodiment (illustrated in FIG. 24) except that a wavelength-selection fiber coupler 50 including a fiber grating is provided instead of the fiber grating 23 in FIG. 24. The wavelength-selection fiber coupler 50 is comprised of a first optical fiber 51 and a second optical fiber 52 coupled to the first optical fiber 51. The first optical fiber 51 includes a plurality of refractive-index variation portions which are similar to those included in the fiber grating 23 in the fifteenth embodiment.

In the construction of FIG. 26, the laser beam 11 is collected by the condenser lens 40, enters the second optical fiber 52, and propagates in the second optical fiber 52. Then, the laser beam 11 is split into two portions in the wavelength-selection fiber coupler 50. The first portion of the laser beam 11 propagates from the second optical fiber 52 to the first optical fiber 51 through the coupling between the first optical fiber 51 and the second optical fiber 52. The second portion of the laser beam 11 propagates through the second optical fiber 52, exits from the forward-side end surface of the second optical fiber 52, is collected by the condenser lens 41, and enters the optical channel waveguide 18 in the optical wavelength conversion element 15, in which the second portion of the laser beam 11 is partially converted to a second harmonic 19. Both of the second harmonic 19 and an unconverted portion of the laser beam 11 exit from the optical wavelength conversion element 15 as divergent light, and are collimated by the collimator lens 20. Then, the second harmonic 19 is separated from the unconverted portion of the laser beam 11 so that users can utilize the second harmonic 19 for various purposes. In order to separate the second harmonic 19 from the laser beam 11, one of the aforementioned techniques can be used as appropriate.

On the other hand, the above first portion of the laser beam 11 is diffracted and reflected by the plurality of refractive-index variation portions included in the first optical fiber 51. The diffracted and reflected laser beam 11 is fed back to the semiconductor laser element 100 through the condenser lens 40. Therefore, the semiconductor laser module as the seventeenth embodiment of the present invention has similar advantages to the twentieth embodiment (illustrated in FIG. 20).

Twenty-First Embodiment

Figure 27:
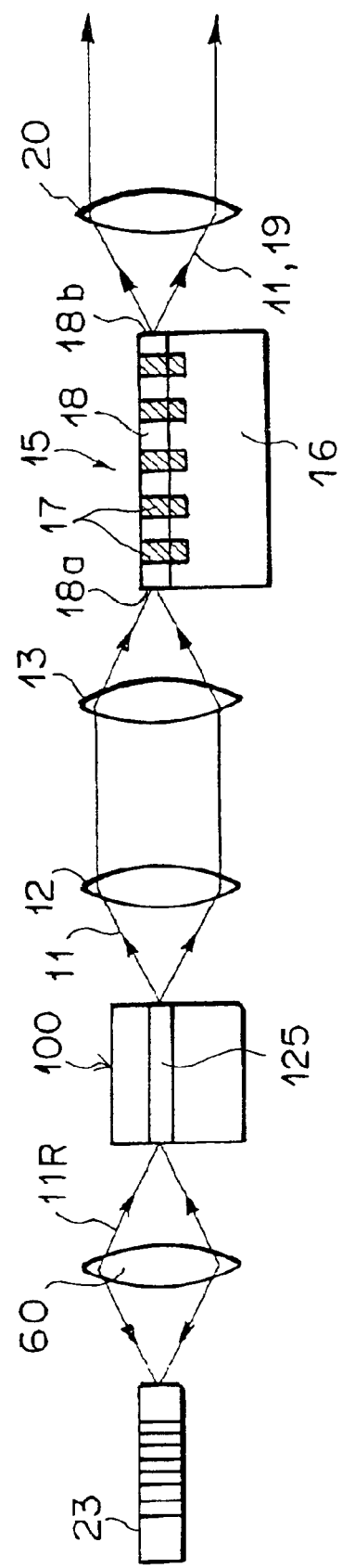
FIG. 27 is a side view of the construction of the twenty-first embodiment of the semiconductor laser module according to the present invention.

FIG. 27 is a side view of the construction of the twenty-first embodiment of the semiconductor laser module according to the present invention.

In the semiconductor laser module as the twenty-first embodiment, the oscillation wavelength can be selected and locked by using the backward light 11R which is emitted backward from the semiconductor laser element 100. Specifically, the backward light 11R is collected by a condenser lens 60 so that the backward laser beam 11R converges and enters a fiber grating 23. Then, the backward laser beam 11R is diffracted and reflected by a plurality of refractive-index variation portions included in the fiber grating 23. The diffracted and reflected backward laser beam 11R is fed back to the semiconductor laser element 100 through the condenser lens 60. Therefore, the semiconductor laser module as the twenty-first embodiment of the present invention has similar advantages to the fifteenth embodiment (illustrated in FIG. 20).

Advantages and Variations of Second to Twenty-First Embodiments

In the second to twenty-first embodiments, the same semiconductor laser element 100 as the first embodiment is used. That is, the thicknesses of the plurality of quantum-well sublayers in the MQW active layer 125 of the semiconductor laser element 100 are different. Therefore, the peak width of the overall gain spectrum of the entire MQW active layer 125 is increased by the difference in the thickness. Thus, the oscillation wavelength can be selected and locked in a wide wavelength range.

In the first to twenty-first embodiments, the substrate 16 is produced by cutting an ingot made of a MgO-LO crystal by a plane perpendicular to a Y' axis, which is obtained by rotating the Y axis in the Y-Z plane toward the Z axis by an angle θ of 3 degrees, as explained before with reference to FIG. 5. Alternatively, it is possible to use a substrate which is cut by a plane oriented in another direction. For example, preferably, the substrate 16 can be produced by cutting an ingot 16" made of a MgO-LO crystal by a plane perpendicular to a Z" axis which is obtained by rotating the Z axis in the Z-X plane toward the X axis by an angle θ of 87 degrees as illustrated in FIG. 28, and polishing the cut surface. This substrate is called a 87-degree Z-cut substrate.

In the 3-degree Y-cut substrate and the 87-degree Z-cut substrate, both of the Y axis and Z axis are different from the directions of the surfaces or the normals of the substrates. However, when at least the Z axis is different from the directions of the surfaces or the normals of the substrates, similar advantages to those obtained in the above cases are obtained.

Twenty-Second Embodiment

FIG. 29 is a side view of the construction of the twenty-second embodiment of the semiconductor laser module according to the present invention.

The semiconductor laser module as the twenty-second embodiment is basically identical to the semiconductor laser module as the fourth embodiment (illustrated in FIG. 9) except that a semiconductor laser element 100' is directly coupled to the backward-side end facet of the optical wavelength conversion element 15, as illustrated in FIG. 29. The oscillation wavelength of the semiconductor laser element 100' can be selected and locked in a similar manner to the fourth embodiment.

The near-field pattern of light oscillated by the semiconductor laser element 100' in the fundamental mode is similar to the electric field pattern of light guided in the optical channel waveguide 18 in the optical wavelength conversion element 15. Therefore, the light oscillated by the semiconductor laser element 100' can be coupled to the optical channel waveguide 18 in the optical wavelength conversion element 15 with a high efficiency of about 60 to 80% or higher.

The semiconductor laser element 100' used in the twenty-second embodiment has basically the same structure as the semiconductor laser element 100 used in the first to twenty-first embodiments, except that the undoped multiple-quantum-well (MQW) active layer 125' is comprised of a $GaAs_{0.75}P_{0.25}$ barrier sublayer having a thickness of 9 nm, an $In_{0.15}Ga_{0.85}As$ first quantum-well sublayer having a thickness of 5 nm, an $In_{0.13}Ga_{0.87}As_{0.75}P_{0.25}$ barrier sublayer having a thickness of 4 nm, an $In_{0.15}Ga_{0.85}As$ second quantum-well sublayer having a thickness of 6 nm, an $In_{0.13}Ga_{0.87}As_{0.75}P_{0.25}$ barrier sublayer having a thickness of 4 nm, an $In_{0.15}Ga_{0.85}As$ third quantum-well sublayer having a thickness of 7 nm, and a $GaAs_{0.75}P_{0.25}$ barrier sublayer having a thickness of 9 nm. That is, the undoped multiple-quantum-well (MQW) active layer 125' in the twenty-second embodiment and the undoped multiple-quantum-well (MQW) active layer 125 in the first to twenty-first embodiments are different in the thicknesses of the first and third quantum-well sublayers. However, in the twenty-second embodiment, the three quantum-well sublayers also have different thicknesses. Therefore, the peak width of the gain peak in the overall gain spectrum of the entire MQW active layer 125' is increased by the difference in the thickness. Thus, the oscillation wavelength can be selected and locked in a wide wavelength range.

Twenty-Third Embodiment

Figure 30:
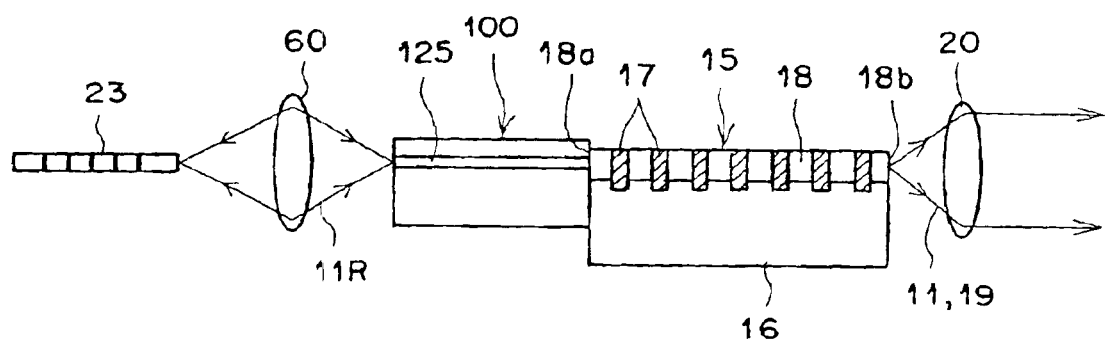
FIG. 30 is a side view of the construction of the twenty-third embodiment of the semiconductor laser module according to the present invention.

FIG. 30 is a side view of the construction of the twenty-third embodiment of the semiconductor laser module according to the present invention.

The semiconductor laser module as the twenty-third embodiment is basically identical to the semiconductor laser module as the twenty-first embodiment (illustrated in FIG. 27) except that the semiconductor laser element 100 is directly coupled to the backward-side end facet of the optical wavelength conversion element 15, as illustrated in FIG. 30. Therefore, the oscillation wavelength of the semiconductor laser element 100 can be selected and locked in a similar manner to the twenty-first embodiment.

Twenty-Fourth Embodiment

Figure 31:
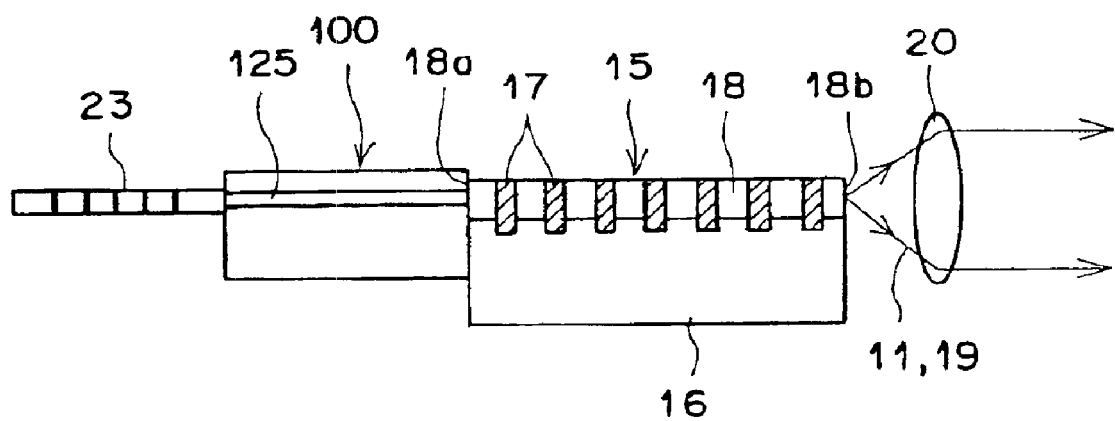
FIG. 31 is a side view of the construction of the twenty-fourth embodiment of the semiconductor laser module according to the present invention.

FIG. 31 is a side view of the construction of the twenty-fourth embodiment of the semiconductor laser module according to the present invention.

The semiconductor laser module as the twenty-fourth embodiment is basically identical to the semiconductor laser module as the twenty-third embodiment (illustrated in FIG. 30) except that the fiber grating 23 (as a wavelength selection element) is directly coupled to the backward-side end facet of the semiconductor laser element 100, as illustrated in FIG. 31. Therefore, the oscillation wavelength of the semiconductor laser element 100 can be selected and locked in a similar manner to the twenty-third embodiment.

Twenty-Fifth Embodiment

Figure 32:
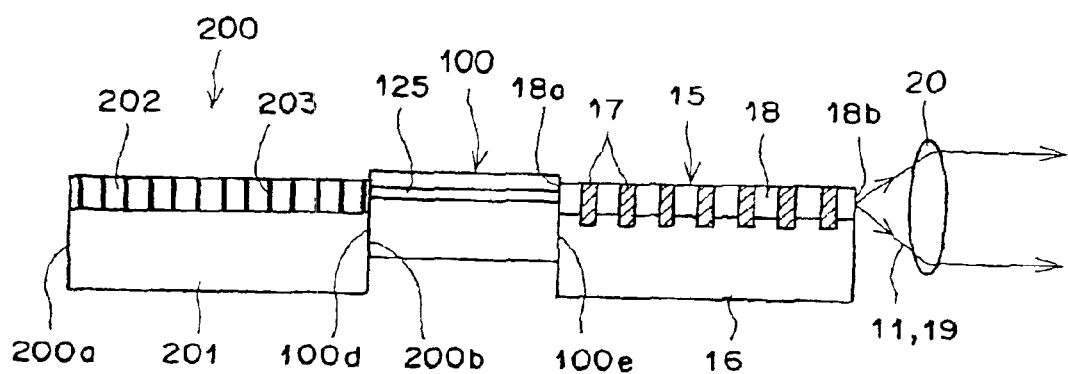
FIG. 32 is a side view of the construction of the twenty-fifth embodiment of the semiconductor laser module according to the present invention.

FIG. 32 is a side view of the construction of the twenty-fifth embodiment of the semiconductor laser module according to the present invention.

The semiconductor laser module as the twenty-fifth embodiment is basically identical to the semiconductor laser module as the twenty-fourth embodiment (illustrated in FIG. 31) except that the fiber grating 23 is replaced with a waveguide-type optical wavelength selection element 200, as illustrated in FIG. 32. The waveguide-type optical wavelength selection element 200 is produced by forming a optical channel waveguide 202 on a substrate 201 made of, for example, a $LiNbO_3$ crystal doped with MgO, and a DBR (distributed Bragg reflection) grating 203 along the optical channel waveguide 202.

In the semiconductor laser module of the twenty-fifth embodiment, a coating having a reflectance of about 30% is formed on the forward-side end facet 100e of the semiconductor laser element 100, and a low-reflectance (LR) coating having a reflectance of about 0.1% or below is formed on the forward-side end facet 200b of the waveguide-type optical wavelength selection element 200. In addition, a low-reflectance (LR) coating having a reflectance of about 0.1% or below is formed on the backward-side end facet 100d of the semiconductor laser element 100.

In the above construction, the semiconductor laser element 100 does not oscillate in a Fabry-Perot mode, and the waveguide-type optical wavelength selection element 200 functions as a resonator mirror constituting an external resonator. Although almost no light reaches the backward-side end facet 200a of the waveguide-type optical wavelength selection element 200, it is possible to exclude an influence of unnecessary reflectance by forming a low-reflectance (LR) coating having a reflectance of about 0.1 to 1% on the backward-side end facet 200a of the waveguide-type optical wavelength selection element 200.

In the construction of FIG. 32, a backward laser beam 11R, which is emitted backward from the backward-side end facet 100d (the left-side end facet) of the semiconductor laser element 100, enters the optical channel waveguide 202 in the waveguide-type optical wavelength selection element 200, and propagates in the optical channel waveguide 202 in a guided mode. Then, the backward laser beam 11R is diffracted and reflected by the DBR grating 203 in the waveguide-type optical wavelength selection element 200. Since the DBR grating 203 has a function of selecting a wavelength of light diffracted and reflected by the DBR grating 203, only a portion of the backward laser beam 11R having the selected wavelength is fed back to the semiconductor laser element 100. Therefore, the oscillation wavelength of the semiconductor laser element 100 can be selected and locked. Thus, a stable second harmonic 19 can be obtained.

In the twenty-third to twenty-fifth embodiments, the thicknesses of the plurality of quantum-well sublayers in the MQW active layer 125 of the semiconductor laser element 100 are different. Therefore, the peak width of the gain peak in the overall gain spectrum of the entire MQW active layer 125 is increased by the difference in the thickness. Thus, the oscillation wavelength can be selected and locked in a wide wavelength range.

Twenty-Sixth Embodiment

Figure 33:
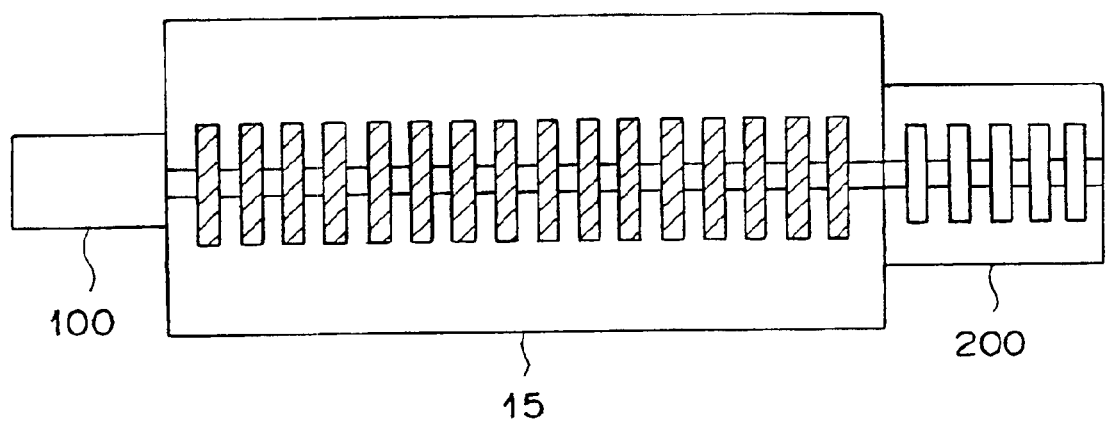
FIG. 33 is a side view of the construction of the twenty-sixth embodiment of the semiconductor laser module according to the present invention.

FIG. 33 is a side view of the construction of the twenty-sixth embodiment of the semiconductor laser module according to the present invention.

The semiconductor laser module as the twenty-sixth embodiment is different from the semiconductor laser module as the twenty-fifth embodiment (illustrated in FIG. 32) in the order of arrangement of the semiconductor laser element 100, the optical wavelength conversion element 15, and the waveguide-type optical wavelength selection element 200. That is, the semiconductor laser module as the twenty-sixth embodiment is identical to the semiconductor laser module as the twenty-fifth embodiment (illustrated in FIG. 32) except that the optical wavelength conversion element 15 is arranged between the semiconductor laser element 100 and the waveguide-type optical wavelength selection element 200, as illustrated in FIG. 33.

In the semiconductor laser module of the twenty-sixth embodiment, a low-reflectance (LR) coating which exhibits a low reflectance at the wavelength of the fundamental harmonic emitted from the semiconductor laser element 100 is formed on the forward-side end facet of the semiconductor laser element 100, and a high-reflectance (HR) coating which exhibits a high reflectance at the wavelength of the fundamental harmonic emitted from the semiconductor laser element 100 is formed on the backward-side end facet of the semiconductor laser element 100. In addition, antireflection (AR) coatings which are transparent to the fundamental harmonic emitted from the semiconductor laser element 100 are formed on the both end facets of the optical wavelength conversion element 15 and both end facets of the waveguide-type optical wavelength selection element 200.

In the construction of FIG. 33, a portion, having a selected wavelength, of the fundamental harmonic which enters the waveguide-type optical wavelength selection element 200 is diffracted and reflected by the DBR grating 203 in the waveguide-type optical wavelength selection element 200, and fed back to the semiconductor laser element 100. Therefore, the oscillation wavelength of the semiconductor laser element 100 can be selected and locked. Thus, a stable second harmonic 19 can be obtained.

Twenty-Seventh Embodiment

FIG. 34 is a side view of the construction of the twenty-seventh embodiment of the semiconductor laser module according to the present invention.

The semiconductor laser module as the twenty-seventh embodiment is also different from the semiconductor laser module as the twenty-fifth embodiment (illustrated in FIG. 32) in the order of arrangement of the semiconductor laser element 100, the optical wavelength conversion element 15, and the waveguide-type optical wavelength selection element 200. The semiconductor laser module as the twenty-seventh embodiment is identical to the semiconductor laser module as the twenty-fifth embodiment (illustrated in FIG. 32) except that the waveguide-type optical wavelength selection element 200 is arranged between the semiconductor laser element 100 and the optical wavelength conversion element 15, as illustrated in FIG. 34.

In the semiconductor laser module of the twenty-seventh embodiment, a low-reflectance (LR) coating which exhibits a low reflectance at the wavelength of the fundamental harmonic emitted from the semiconductor laser element 100 is formed on the forward-side end facet of the semiconductor laser element 100, and a high-reflectance (HR) coating which exhibits a high reflectance at the wavelength of the fundamental harmonic is formed on the backward-side end facet of the semiconductor laser element 100. In addition, antireflection (AR) coatings which are transparent to the fundamental harmonic are formed on the both end facets of the optical wavelength conversion element 15 and both end facets of the waveguide-type optical wavelength selection element 200. Alternatively, an antireflection (AR) coating which is transparent to the fundamental harmonic, instead of the low-reflectance (LR) coating, may be formed on the forward-side end facet of the semiconductor laser element 100.

In the construction of FIG. 34, a portion, having a selected wavelength, of the fundamental harmonic which enters the waveguide-type optical wavelength selection element 200 is diffracted and reflected by the DBR grating 203 in the waveguide-type optical wavelength selection element 200, and fed back to the semiconductor laser element 100. Therefore, the oscillation wavelength of the semiconductor laser element 100 can be selected and locked. Thus, a stable second harmonic 19 can be obtained.

Twenty-Eighth Embodiment

FIG. 35 is a side view of the construction of the twenty-eighth embodiment of the semiconductor laser module according to the present invention.

The semiconductor laser module as the twenty-eighth embodiment is different from the semiconductor laser module as the twenty-fifth embodiment (illustrated in FIG. 32) in the backward-side 200a' of the waveguide-type optical wavelength selection element 200'.

In the semiconductor laser module of the twenty-eighth embodiment, low-reflectance (LR) coatings which exhibit a low reflectance at the wavelength of the fundamental harmonic emitted from the semiconductor laser element 100 are formed on the forward-side and backward-side end facets of the semiconductor laser element 100. In addition, antireflection (AR) coatings which are transparent to the fundamental harmonic are formed on the both end facets of the optical wavelength conversion element 15 and both end facets of the waveguide-type optical wavelength selection element 200'.

In the construction of FIG. 35, a backward laser beam 11R, which is emitted backward from the backward-side end facet of the semiconductor laser element 100, is diffracted and reflected in the waveguide-type optical wavelength selection element 200. Since the DBR grating 203 has a function of selecting a wavelength of light diffracted and reflected by the DBR grating 203, only a portion of the backward laser beam 11R having the selected wavelength is fed back to the semiconductor laser element 100. Therefore, the oscillation wavelength of the semiconductor laser element 100 can be selected and locked. Thus, a stable second harmonic 19 can be obtained.

As illustrated in FIG. 35, the backward-side end facet 200a' of the waveguide-type optical wavelength selection element 200 is beveled with respect to the direction in which the optical channel waveguide 202 in the waveguide-type optical wavelength selection element 200' extends. Therefore, the fundamental harmonic which is reflected by the backward-side end facet 200a' does not enter the optical channel waveguide 202. That is, the fundamental harmonic which is reflected by the backward-side end facet 200a' does not fed back to the semiconductor laser element 100 as return light. Thus, it is possible to prevent noise production and output power variation due to the return light.

Twenty-Ninth Embodiment

FIG. 36 is a side view of the construction of the twenty-ninth embodiment of the semiconductor laser module according to the present invention.

As illustrated in FIG. 36, in the semiconductor laser module of the twenty-ninth embodiment, a transparent-type optical wavelength selection element 210 is arranged between the semiconductor laser element 100 and the optical wavelength conversion element 15. In addition, low-reflectance (LR) coatings which exhibit a low reflectance at the wavelength of the fundamental harmonic emitted from the semiconductor laser element 100 are formed on the forward-side and backward-side end facets of the semiconductor laser element 100, and antireflection (AR) coatings which are transparent to the fundamental harmonic are formed on the both end facets of the transparent-type optical wavelength selection element 210. Further, an antireflection (AR) coating which is transparent to the fundamental harmonic is formed on the forward-side end facet of the optical wavelength conversion element 15, and a high-reflectance (HR) coating which exhibits a high reflectance at the wavelength of the fundamental harmonic is formed on the forward-side end facet of the optical wavelength conversion element 15.

Since the transparent-type optical wavelength selection element 210 has a function of selecting a wavelength of light which passes through the transparent-type optical wavelength selection element 210, only a portion, having a selected wavelength, of the fundamental harmonic which enters the transparent-type optical wavelength selection element 210 passes through the transparent-type optical wavelength selection element 210. Then, the portion of the fundamental harmonic enters the optical wavelength conversion element 15, and is reflected by the forward-side end facet of the optical wavelength conversion element 15, and is then fed back to the semiconductor laser element 100. Therefore, the oscillation wavelength of the semiconductor laser element 100 can be selected and locked. Thus, a stable second harmonic 19 can be obtained.

In the twenty-sixth to twenty-ninth embodiments, the thicknesses of the plurality of quantum-well sublayers in the MQW active layer 125 of the semiconductor laser element 100 are different. Therefore, the peak width of the gain peak in the overall gain spectrum of the entire MQW active layer 125 is increased by the difference in the thickness. Thus, the oscillation wavelength can be selected and locked in a wide wavelength range.

Figure 37:
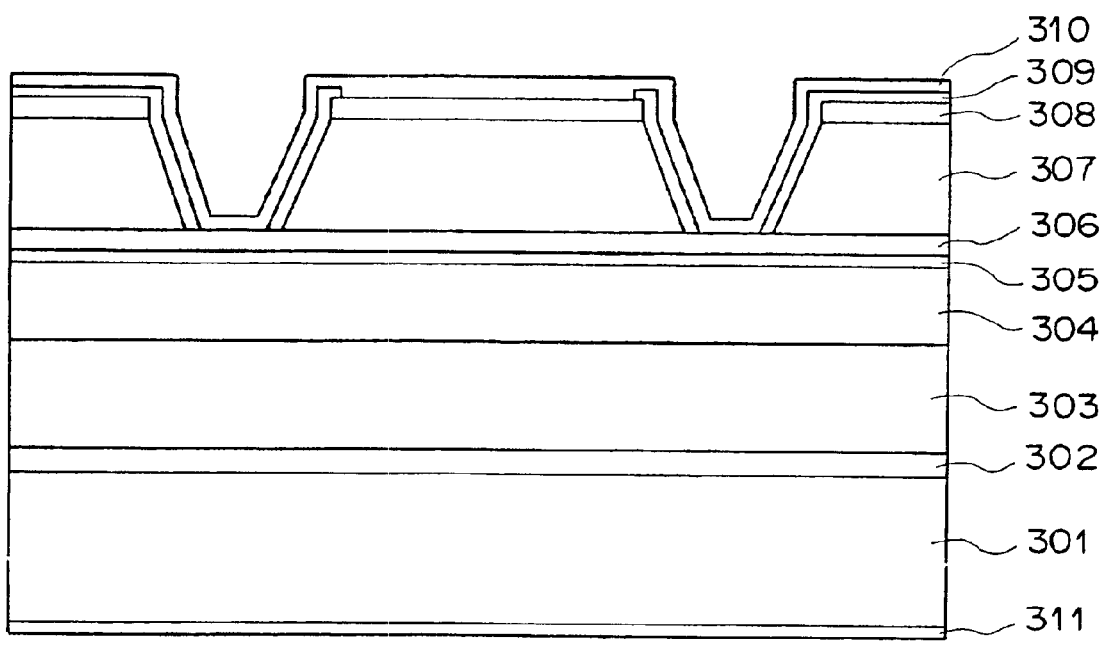
FIG. 37 is a cross-sectional view of of another semiconductor laser element which can be used in the semiconductor laser modules according to the present invention.
Figure 38A:
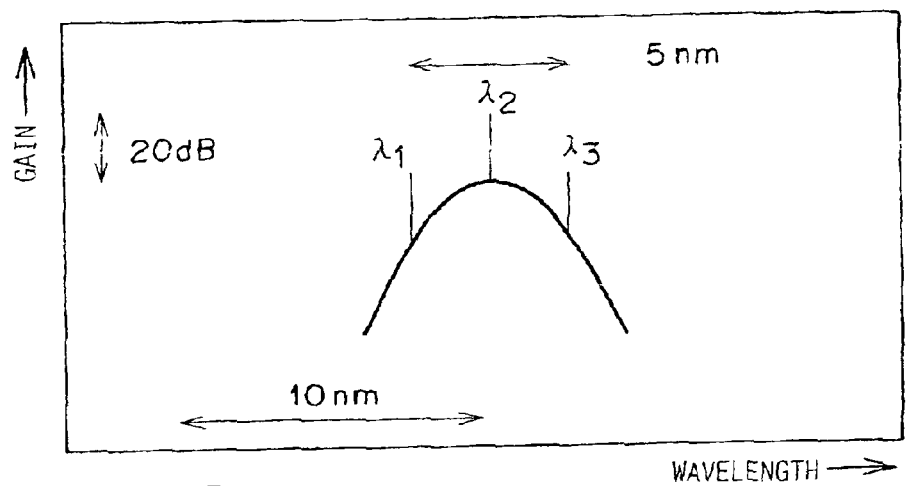
FIG. 38A is a graph indicating an example of an overall gain spectrum of a semiconductor laser element in which a plurality of quantum-well sublayers constituting a multiple-quantum-well active layer have an identical thickness and an identical composition.
Figure 38B:
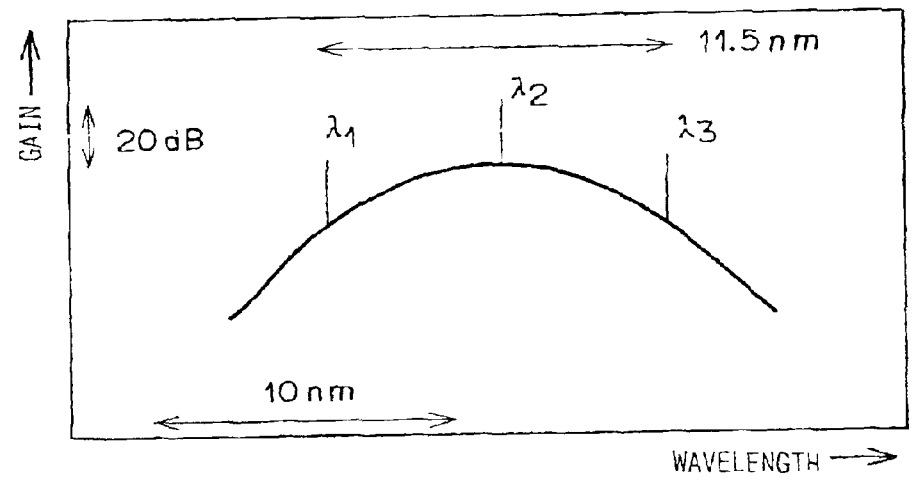
FIG. 38B is a graph indicating an example of an overall gain spectrum of a semiconductor laser element in which at least one of the plurality of quantum-well sublayers constituting the multiple-quantum-well active layer of the semiconductor laser element is different from the other of the plurality of quantum-well sublayers in thickness and/or composition.

Other Matters (i) The semiconductor laser element used in the semiconductor laser module according to the present invention is not limited to the aforementioned semiconductor laser element 100 or 100'. For example, the semiconductor laser element 300 illustrated in FIG. 37 can also be used. The semiconductor laser element 300 of FIG. 37 is a ridge-waveguide type fundamental-transverse-mode semiconductor laser device comprised of an n-type GaAs substrate 301, an n-type GaAs buffer layer 302, an n-type InGaP cladding layer 303, an InGaAsP optical waveguide layer 304, a multiple-quantum-well (MQW) active layer 305, an InGaAsP optical waveguide layer 306, a p-type InGaP cladding layer 307, a p-type GaAs cap layer 308, a $SiO_2$ layer 309, a p electrode 310, and an n electrode 311.

The peak width of the gain peak in the overall gain spectrum of the entire MQW active layer 305 can be increased by arranging the chemical composition and/or thickness of at least one of a plurality of quantum-well sublayers in the MQW active layer 305 differently from the chemical compositions and/or thicknesses of the other quantum-well sublayers. Thus, when the semiconductor laser element 300 illustrated in FIG. 37 is used in the semiconductor laser module according to the present invention, similar advantages to those obtained in the above embodiments are obtained.

(ii) In each of the semiconductor laser modules as the above embodiments, a laser beam being emitted from a semiconductor laser element formed on a GaAs substrate and having the center wavelength of 946 nm is converted to a second harmonic having a wavelength of 473 nm. However, the present invention is not limited to such semiconductor laser modules. For example, the semiconductor laser element used in the semiconductor laser module according to present invention may be a semiconductor laser element formed on a GaAs substrate and having any other wavelength in a wavelength range of 630 to 1,100 nm, or a semiconductor laser element formed on an InP substrate and having a wavelength in a wavelength range of 1,250 to 1,700 nm.

(iii) An electro-optic modulation portion, which modulates light propagating in the optical wavelength conversion element, can be arranged on the upstream side of the domain-inverted portions in the optical waveguide. A semiconductor laser module comprising such an optical wavelength conversion element is disclosed, for example, in Japanese Unexamined Patent Publication (JPP) No. 10(1998)-161165, which is assigned to the present assignee. The contents of JPP No. 10(1998)-161165 are incorporated in this specification by reference.

What is claimed is:

1. A semiconductor laser module comprising:

a semiconductor laser element which emits laser light;

an optical wavelength selection element which selects a first portion of said laser light having a predetermined wavelength in order to feed back said first portion of said laser light to said semiconductor laser element; and an optical wavelength conversion element which includes an optical waveguide, receives a second portion of said laser light in said optical waveguide, and converts said second portion of said laser light to wavelength-converted laser light having a converted wavelength;

said semiconductor laser element comprises a multiple-quantum-well active layer including a plurality of quantum-well sublayers each having a thickness and a composition, where one of the plurality of quantum-well sublayers is different from another of the plurality of quantum-well sublayers in at least one of the thickness and the composition, wherein an optical wavelength range of an overall gain spectrum of said multiple-quantum-well active layer comprises a gain spectrum of said one of the plurality of quantum-well sublayers and a gain spectrum of said another of the plurality of quantum-well sublayers, said gain spectrum of said one of the plurality of quantum-well sublayers being different from said gain spectrum of said another of the plurality of quantum-well sublayers, and both said gain spectrum of said one of the plurality of quantum-well sublayers and said gain spectrum of said another of the plurality of quantum-well sublayers contributing to the optical wavelength range of said overall gain spectrum.

2. A semiconductor laser module according to claim 1, wherein said optical wavelength selection element is a transparent-type optical wavelength selection element arranged between said semiconductor laser element and said optical wavelength conversion element, and selects said first portion of said laser light after said laser light is reflected by an end facet of said optical wavelength conversion element.

3. A semiconductor laser module according to claim 1, wherein said optical wavelength selection element is a bulk grating.

4. A semiconductor laser module according to claim 1, wherein said semiconductor laser element is coupled to an end facet of said optical wavelength conversion element.

5. A semiconductor laser module according to claim 1, further comprising a reflection unit which reflects a third portion of said laser light after said third portion of said laser light propagates through said optical wavelength conversion element, in order to feed back said third portion of said laser light to said semiconductor laser element, and said optical wavelength selection element is a transparent-type optical wavelength selection element arranged in an optical path of said third portion of said laser light between said reflection unit and said semiconductor laser element.

6. A semiconductor laser module according to claim 5, wherein said optical wavelength selection element is a thin-film narrow-band-pass filter formed on a surface of said reflection unit.

7. A semiconductor laser module according to claim 5, further comprising an optical system which separates said wavelength-converted laser light from said third portion of said laser light.

8. A semiconductor laser module according to claim 1, further comprising a reflection unit which reflects a third portion of said laser light which is emitted from said semiconductor laser element in a direction opposite to a direction toward said optical wavelength conversion element, in order to feed back said third portion of said laser light to said semiconductor laser element, and said optical wavelength selection element is a transparent-type optical wavelength selection element arranged in an optical path of said third portion of said laser light between said reflection unit and said semiconductor laser element.

9. A semiconductor laser module according to claim 8, wherein said optical wavelength selection element is a thin-film narrow-band-pass filter formed on a surface of said reflection unit.

10. A semiconductor laser module according to claim 1, wherein said optical wavelength selection element is a narrow-band-pass filter.

11. A semiconductor laser module according to claim 10, wherein said narrow-band-pass filter is realized by a thin-film band-pass filter.

12. A semiconductor laser module according to claim 11, wherein said thin-film band-pass filter is formed on a light-exit end facet of said semiconductor laser element from which said laser light is emitted.

13. A semiconductor laser module according to claim 1, wherein said optical wavelength selection element is a reflection-type optical wavelength selection element arranged between said semiconductor laser element and said optical wavelength conversion element, and selectively reflects said first portion of said laser light in order to feed back said first portion of said laser light to said semiconductor laser element.

14. A semiconductor laser module according to claim 13, wherein said optical wavelength selection element is a fiber grating realized by an optical fiber having a core in which a plurality of refractive-index variation portions are formed at regular intervals.

15. A semiconductor laser module according to claim 14, further comprising a convergence optical system which converges said laser light on an end surface of said fiber grating.

16. A semiconductor laser module according to claim 1, wherein said optical wavelength selection element is a reflectance-type optical wavelength selection element, and selectively reflects said first portion of said laser light after said first portion of said laser light propagates through said optical wavelength conversion element, in order to feed back said first portion of said laser light to said semiconductor laser element.

17. A semiconductor laser module according to claim 16, wherein said optical wavelength selection element is a fiber grating realized by an optical fiber having a core in which a plurality of refractive-index variation portions are formed at regular intervals.

18. A semiconductor laser module according to claim 17, further comprising a convergence optical system which converges said laser light on an end surface of said fiber grating.

19. A semiconductor laser module according to claim 16, further comprising an optical system which separates said wavelength-converted laser light from said second portion of said laser light after said second portion of said laser light propagates through said optical wavelength conversion element.

20. A semiconductor laser module according to claim 1, wherein said first portion of said laser light is emitted by said semiconductor laser element in a direction opposite to a direction toward said optical wavelength conversion element, and said optical wavelength selection element is a reflectance-type optical wavelength selection element, and selectively reflects said first portion of said laser light in order to feed back said first portion of said laser light to said semiconductor laser element.

21. A semiconductor laser module according to claim 20, wherein said optical wavelength selection element is a fiber grating realized by an optical fiber having a core in which a plurality of refractive-index variation portions are formed at regular intervals.

22. A semiconductor laser module according to claim 21, further comprising a convergence optical system which converges said laser light on an end surface of said fiber grating.

23. A semiconductor laser module according to claim 1, further comprising,
an optical splitting unit which splits a third portion of said laser light from said second portion of said laser light which is received by said optical wavelength conversion element, and
a reflection unit which reflects said third portion of said laser light in order to feed back said third portion of said laser light to said semiconductor laser element, and said optical wavelength selection element is a transparent-type optical wavelength selection element arranged in an optical path of said third portion of said laser light between said reflection unit and said semiconductor laser element.

24. A semiconductor laser module according to claim 23, wherein said optical wavelength selection element is a thin-film narrow-band-pass filter formed on a surface of said reflection unit.

25. A semiconductor laser module according to claim 1, wherein said optical wavelength conversion element further comprises,
a substrate made of a ferroelectric crystal exhibiting a nonlinear optical effect, where said optical waveguide is extends along a surface of said substrate, and
a plurality of domain-inverted portions periodically formed along said optical waveguide, where a direction of spontaneous polarization is inverted in said plurality of domain-inverted portions, and
said optical wavelength conversion element converts said second portion of said laser light to said wavelength-converted laser light when said second portion of said laser light propagates in said optical waveguide.

26. A semiconductor laser module according to claim 25, wherein said direction of said spontaneous polarization is inclined at an angle relative to said surface of said substrate, in a plane perpendicular to a direction in which said optical waveguide extends, where said angle is greater than 0 degrees and smaller than 90 degrees.

27. A semiconductor laser module according to claim 1, wherein said plurality of quantum-well sublayers include:
a first quantum-well sublayer having a first thickness;
a second quantum-well sublayer having a second thickness;
a third quantum-well sublayer having a third thickness, wherein
the first thickness is different from the second thickness and third thickness, and the second thickness is different from the third thickness.

28. A semiconductor laser module according to claim 27, wherein said plurality of quantum-well sublayers include:
a first quantum-well sublayer having a first composition;
a second quantum-well sublayer having a second composition;
a third quantum-well sublayer having a third composition, wherein
the first composition is different from the second composition and third composition, and the second composition is different from the third composition.

29. A semiconductor laser module according to claim 28, wherein said plurality of quantum-well sublayers further includes:
a fourth quantum-well sublayer having a fourth thickness, wherein
the fourth thickness is different from the first thickness, the second thickness, and third thickness.

30. A semiconductor laser module comprising:
a semiconductor laser element which has a light-exit end facet, and emits laser light through said light-exit end facet;
an optical wavelength conversion element which comprises an optical waveguide and an end facet, receives a first portion of said laser light having a predetermined wavelength in said optical waveguide, and converts said first portion of said laser light to wavelength-converted laser light having a converted wavelength, where said end facet of said optical wavelength conversion element reflects a second portion of said laser light, and said semiconductor laser element is coupled to said end facet of said optical wavelength conversion element through a transparent-type thin-film narrow-band-pass filter; and
said transparent-type thin-film narrow-band-pass filter which is sandwiched between said end facet of said optical wavelength conversion element and said light-exit end facet of said semiconductor laser element, and selects a third portion of said laser light having said predetermined wavelength, from said second portion of said laser light reflected by said end facet of said optical wavelength conversion element, in order to feed back said third portion of said laser light to said semiconductor laser element; and
said semiconductor laser element comprises a multiple-quantum-well active layer including a plurality of quantum-well sublayers each having a thickness and a composition, where one of the plurality of quantum-well sublayers is different from another of the plurality of quantum-well sublayers in at least one of the thickness and the composition,
wherein an optical wavelength range of an overall gain spectrum of said multiple-quantum-well active layer comprises a gain spectrum of said one of the plurality of quantum-well sublayers and a gain spectrum of said another of the plurality of quantum-well sublayers,
said gain spectrum of said one of the plurality of quantum-well sublayers being different from said gain spectrum of said another of the plurality of quantum-well sublayers, and
both said gain spectrum of said one of the plurality of quantum-well sublayers and said gain spectrum of said another of the plurality of quantum-well sublayers contributing to the optical wavelength range of said overall gain spectrum.

31. A semiconductor laser module according to claim 30, wherein said optical wavelength conversion element further comprises,
a substrate made of a ferroelectric crystal exhibiting a nonlinear optical effect, where said optical waveguide is extends along a surface of said substrate, and
a plurality of domain-inverted portions periodically formed along said optical waveguide, where a direction of spontaneous polarization is inverted in said plurality of domain-inverted portions, and
said optical wavelength conversion element converts said first portion of said laser light to said wavelength-converted laser light when said first portion of said laser light propagates in said optical waveguide.

32. A semiconductor laser module according to claim 31, wherein said direction of said spontaneous polarization is inclined at an angle relative to said surface of said substrate, in a plane perpendicular to a direction in which said optical waveguide extends, where said angle is greater than 0 degrees and smaller than 90 degrees.

33. A semiconductor laser module comprising:

a semiconductor laser element which has a light-exit end facet, and emits laser light through said light-exit end facet;

an optical wavelength conversion element which comprises an optical waveguide and an end facet, receives a first portion of said laser light having a predetermined wavelength in said optical waveguide, and converts said first portion of said laser light to wavelength-converted laser light having a converted wavelength, where said semiconductor laser element is coupled to said end facet of said optical wavelength conversion element through a reflection-type thin-film narrow-band-pass filter; and said reflection-type thin-film narrow-band-pass filter which is sandwiched between said end facet of said optical wavelength conversion element and said light-exit end facet of said semiconductor laser element, and selectively reflects a second portion of said laser light having said predetermined wavelength in order to feed back said second portion of said laser light to said semiconductor laser element; and said semiconductor laser element comprises a multiple-quantum-well active layer including a plurality of quantum-well sublayers each having a thickness and a composition, where one of the plurality of quantum-well sublayers is different from another of the plurality of quantum-well sublayers in at least one of the thickness and the composition, wherein an optical wavelength range of an overall gain spectrum of said multiple-quantum-well active layer comprises a gain spectrum of said one of the plurality of quantum-well sublayers and a gain spectrum of said another of the plurality of quantum-well sublayers, said gain spectrum of said one of the plurality of quantum-well sublayers being different from said gain spectrum of said another of the plurality of quantum-well sublayers, and both said gain spectrum of said one of the plurality of quantum-well sublayers and said gain spectrum of said another of the plurality of quantum-well sublayers contributing to the optical wavelength range of said overall gain spectrum.

34. A semiconductor laser module according to claim 33, wherein said optical wavelength conversion element further comprises, a substrate made of a ferroelectric crystal exhibiting a nonlinear optical effect, where said optical waveguide is extends along a surface of said substrate, and a plurality of domain-inverted portions periodically formed along said optical waveguide, where a direction of spontaneous polarization is inverted in said plurality of domain-inverted portions, and said optical wavelength conversion element converts said first portion of said laser light to said wavelength-converted laser light when said first portion of said laser light propagates in said optical waveguide.

35. A semiconductor laser module according to claim 34, wherein said direction of said spontaneous polarization is inclined at an angle relative to said surface of said substrate, in a plane perpendicular to a direction in which said optical waveguide extends, where said angle is greater than 0 degrees and smaller than 90 degrees.

* * * * *